(12) United States Patent
Lee et al.

(10) Patent No.: US 12,080,777 B2
(45) Date of Patent: Sep. 3, 2024

(54) COMPOSITE WORK FUNCTION LAYER FORMATION USING SAME WORK FUNCTION MATERIAL

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 12 days.

(21) Appl. No.: 17/814,743

(22) Filed: Jul. 25, 2022

(65) Prior Publication Data

US 2022/0359703 A1    Nov. 10, 2022

Related U.S. Application Data

(63) Continuation of application No. 16/952,503, filed on Nov. 19, 2020, now Pat. No. 11,508,826.
(Continued)

(51) Int. Cl.
| | |
|---|---|
| *H01L 29/49* | (2006.01) |
| *H01L 21/285* | (2006.01) |
| *H01L 21/8234* | (2006.01) |
| *H01L 29/40* | (2006.01) |
| *H01L 29/78* | (2006.01) |

(52) U.S. Cl.
CPC .... *H01L 29/4966* (2013.01); *H01L 21/28568* (2013.01); *H01L 21/82345* (2013.01); *H01L 29/401* (2013.01); *H01L 29/785* (2013.01)

(58) Field of Classification Search
CPC ........... H01L 29/4966; H01L 21/28568; H01L 21/82345; H01L 29/401; H01L 29/785; H01L 21/823842; H01L 29/66795; H01L 29/513; H01L 29/517; H01L 21/28088; H01L 29/66545; H01L 21/823431;
(Continued)

(56) References Cited

U.S. PATENT DOCUMENTS

| | | | |
|---|---|---|---|
| 10,608,097 B2 | 3/2020 | Ma et al. | |
| 10,872,771 B2 | 12/2020 | Raisanen et al. | |

(Continued)

FOREIGN PATENT DOCUMENTS

| | | |
|---|---|---|
| KR | 20190022280 A | 3/2019 |
| KR | 20200019601 A | 2/2020 |
| TW | 201940729 A | 10/2010 |

*Primary Examiner* — Farun Lu
(74) *Attorney, Agent, or Firm* — Slater Matsil, LLP

(57) ABSTRACT

A method includes forming a gate dielectric layer on a semiconductor region, and depositing a first aluminum-containing work function layer using a first aluminum-containing precursor. The first aluminum-containing work function layer is over the gate dielectric layer. A second aluminum-containing work function layer is deposited using a second aluminum-containing precursor, which is different from the first aluminum-containing precursor. The second aluminum-containing work function layer is deposited over the first aluminum-containing work function layer. A conductive region is formed over the second aluminum-containing work function layer.

20 Claims, 23 Drawing Sheets

Related U.S. Application Data

(60) Provisional application No. 63/052,612, filed on Jul. 16, 2020.

(58) Field of Classification Search
CPC ..... H01L 21/823437; H01L 21/823821; H01L 21/823828; H01L 27/0886; H01L 27/0924
See application file for complete search history.

(56) References Cited

U.S. PATENT DOCUMENTS

| | | | |
|---|---|---|---|
| 10,978,350 B2 | 4/2021 | Chen et al. | |
| 2016/0376704 A1* | 12/2016 | Raisanen | C23C 16/45525 |
| 2018/0138045 A1* | 5/2018 | Xu | H01L 29/66795 |
| 2019/0221433 A1 | 7/2019 | Raisanen et al. | |
| 2021/0013111 A1* | 1/2021 | Smith | H01L 27/0922 |

* cited by examiner

US 12,080,777 B2

COMPOSITE WORK FUNCTION LAYER FORMATION USING SAME WORK FUNCTION MATERIAL

PRIORITY CLAIM AND CROSS-REFERENCE

This application is a continuation of U.S. patent application Ser. No. 16/952,503, filed Nov. 19, 2020, and entitled "Composite Work Function Layer Formation Using Same Work Function Material," which claims the benefit of the U.S. Provisional Application No. 63/052,612, filed Jul. 16, 2020, and entitled "A Novel Co-Precursor method of n-WFM TiAlC," which applications are hereby incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be generated at the surface of the semiconductor.

Metal gates may include a plurality of layers, so that the different requirements of NMOS devices and PMOS devices can be met. The formation of metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

The metal gates include work function layers. Conventionally, the work function layers of n-type MOS devices were formed of TiAlC, which may be formed using $TiCl_4$ and triethylaluminum (TEA). Due to the deposition rate limitation, it is difficult to produce ultrathin work function layers having controlled thicknesses, for example, with the thickness of 10 angstroms or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
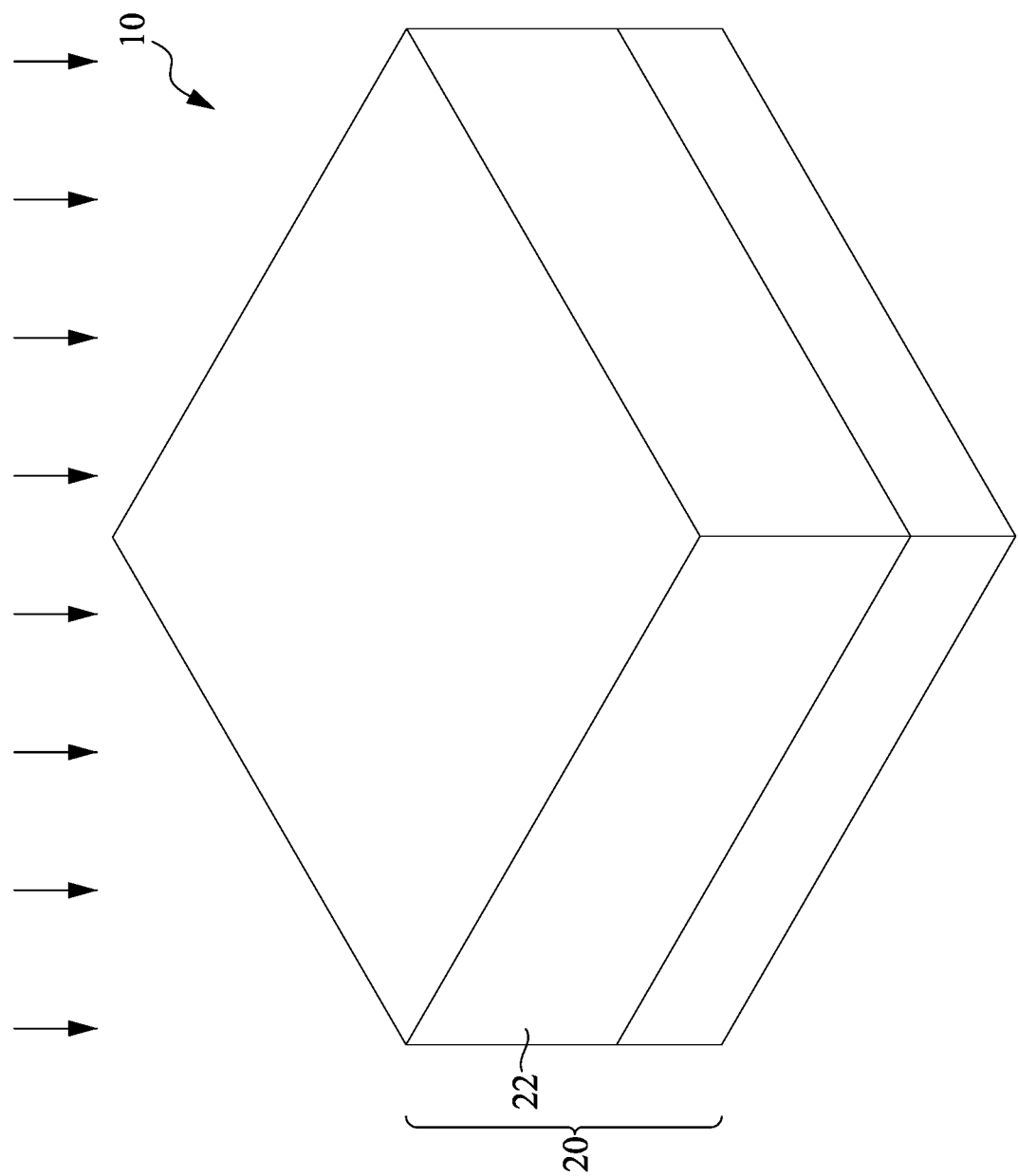
FIGS. 1-6, 7A, 7B, 8-16, 17A, and 17B illustrate the perspective views and cross-sectional views of intermediate stages in the formation of Fin Field-Effect (FinFET) transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The methods of forming work function layers for transistors are provided in accordance with various embodiments. In accordance with some embodiments of the present disclosure, the formation of the work function layers include two or more deposition processes, with different precursors used for forming the same work function material (having different compositions). Atomic Layer Deposition (ALD) may be used to form the work function layers. The lower layer(s) of the work function layer may be formed using a precursor that may result in a greater per-cycle-thickness and/or a higher aluminum percentage, and the upper layer(s) may be formed using a precursor that may result in a smaller per-cycle-thickness and/or a lower aluminum percentage. Accordingly, there may desirably be more aluminum in the lower layer(s), and there is good control in the thickness of the work function layer. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors and devices such as planar transistors and Gate-All-Around (GAA) transistors may also adopt the concept of the present disclosure. Also, TiAlC is used as an example of the work function layers, while work function layers comprising other materials may also be formed adopting the concept of the present disclosure.

Figure 21:
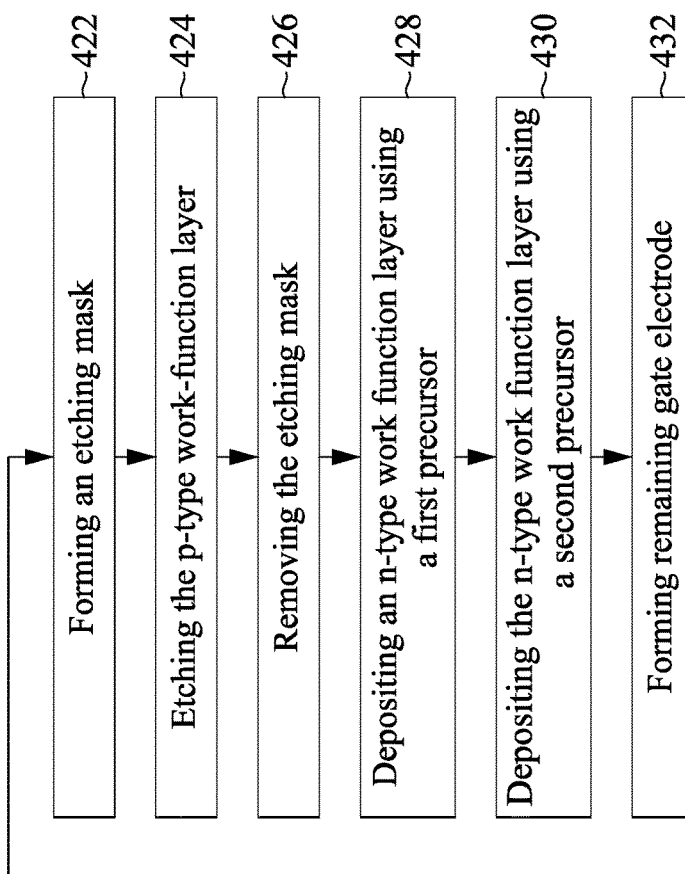
FIG. 21 illustrates a process flow for forming FinFETs in accordance with some embodiments.
Figure 21:
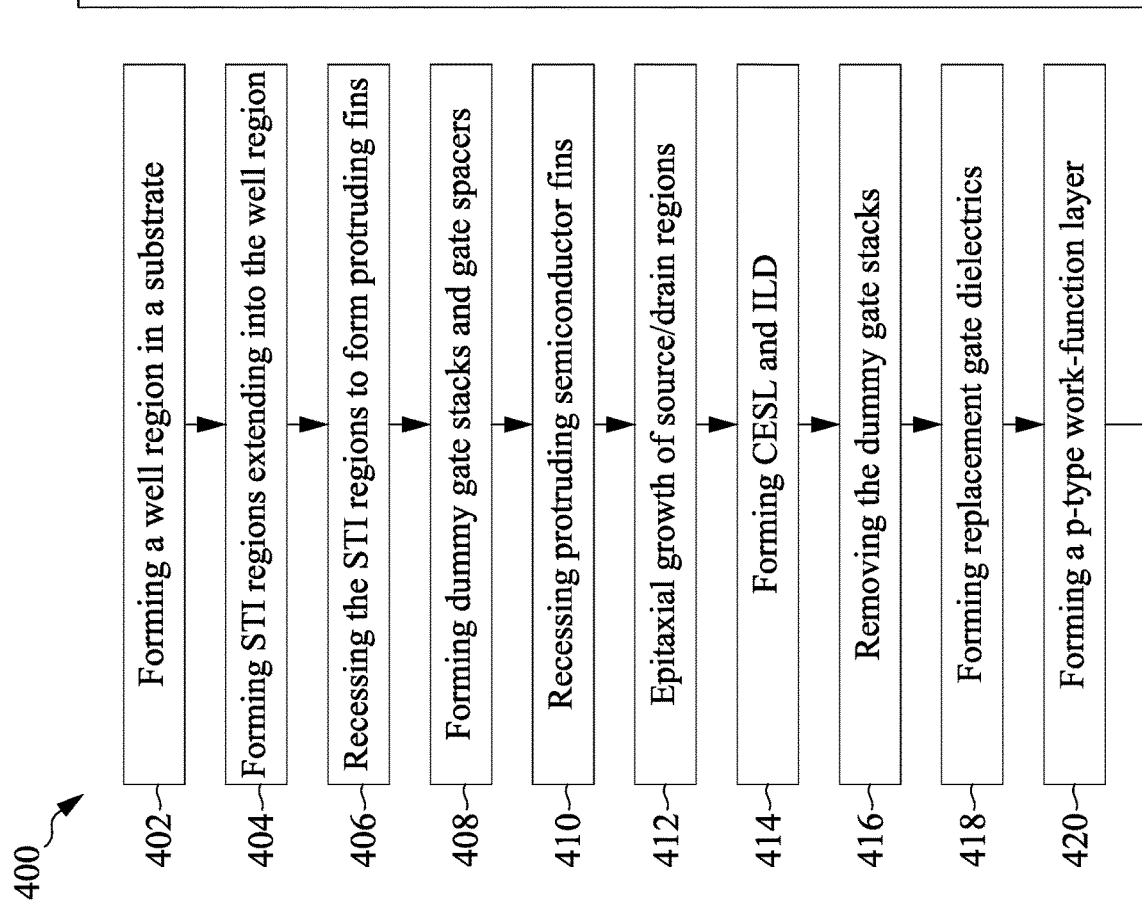

FIGS. 1-6, 7A, 7B, 8-16, 17A, and 17B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 as shown in FIG. 21.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 as shown in FIG. 21. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
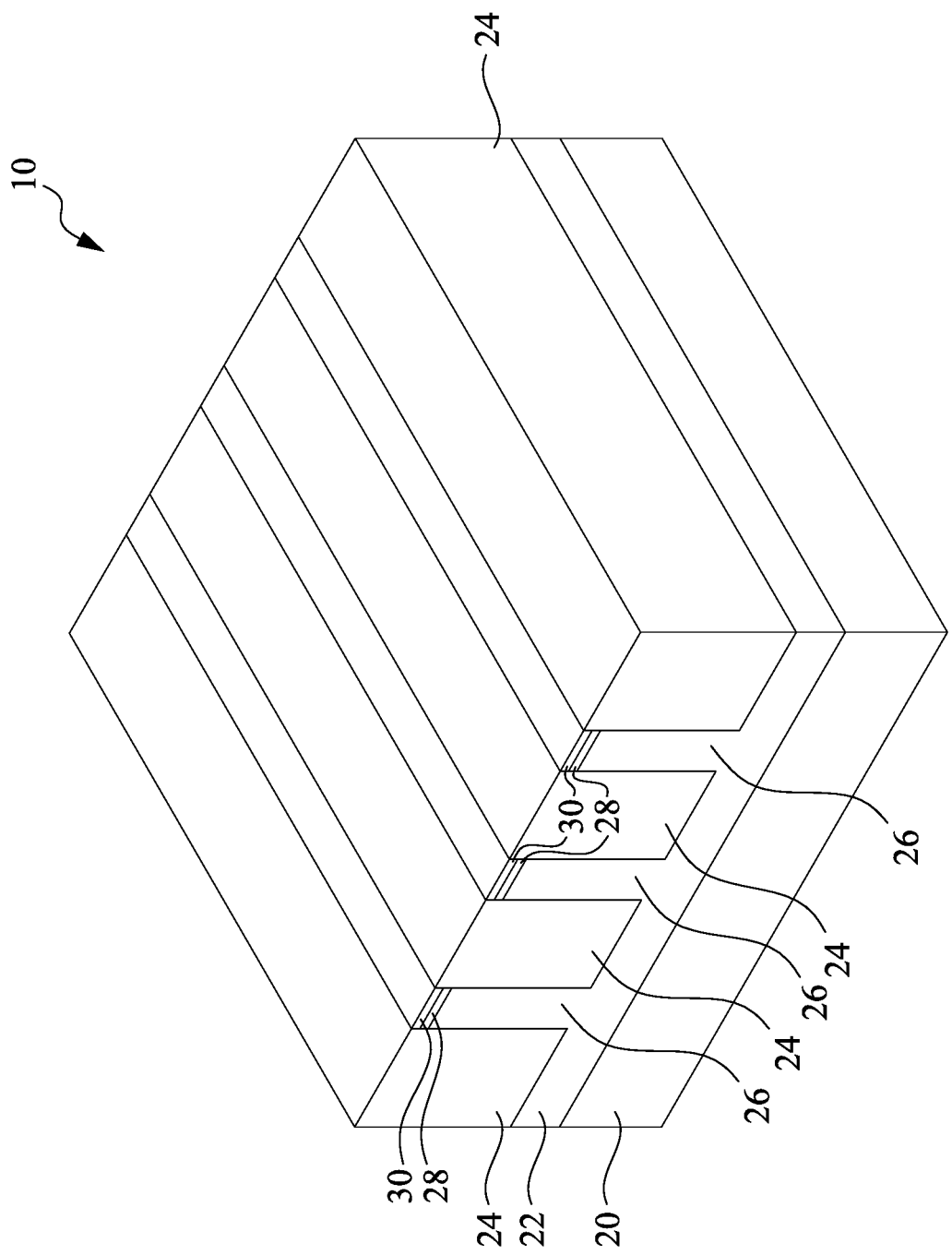

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 as shown in FIG. 21. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
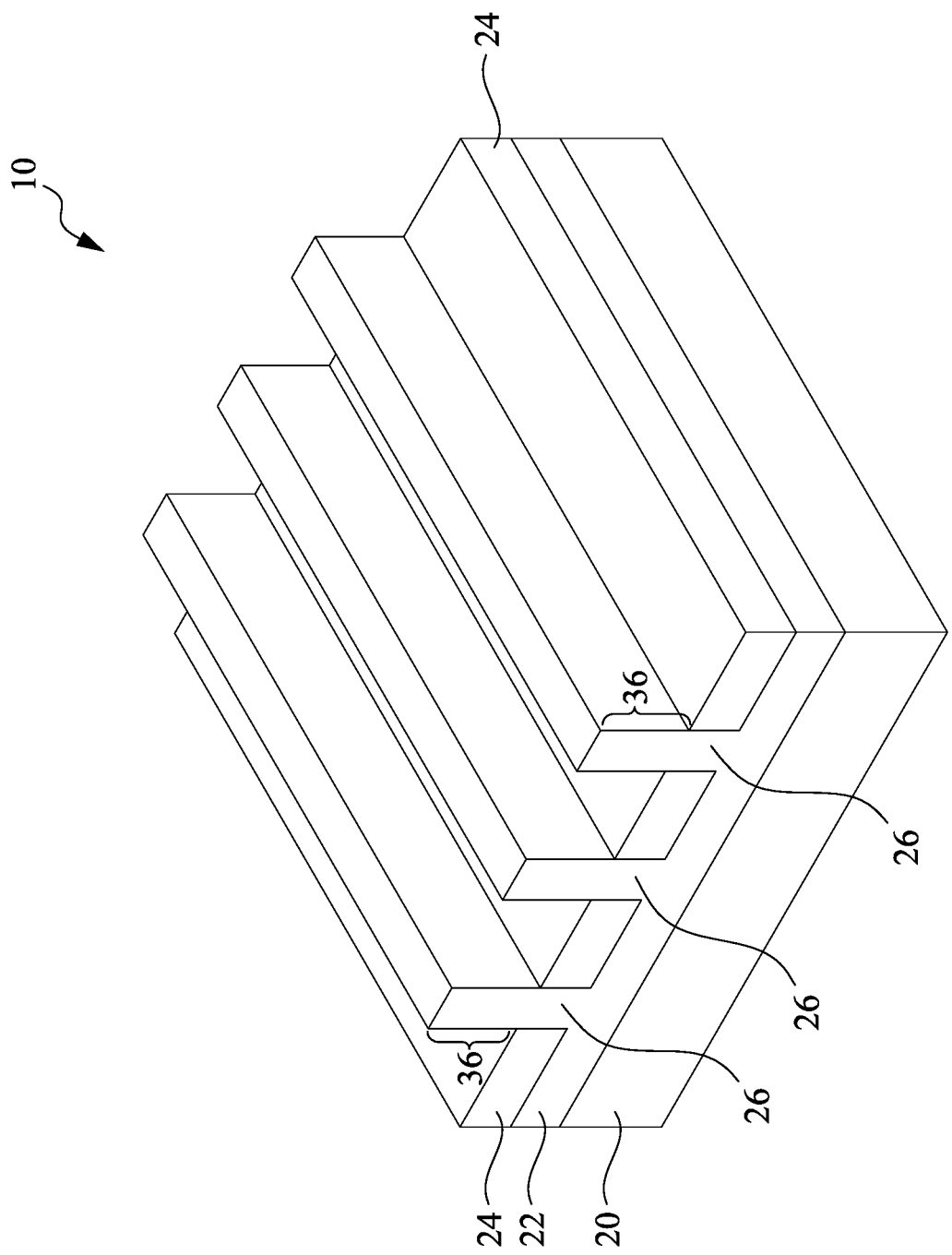

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 as shown in FIG. 21. The etching may be performed using a dry etching process, wherein NF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
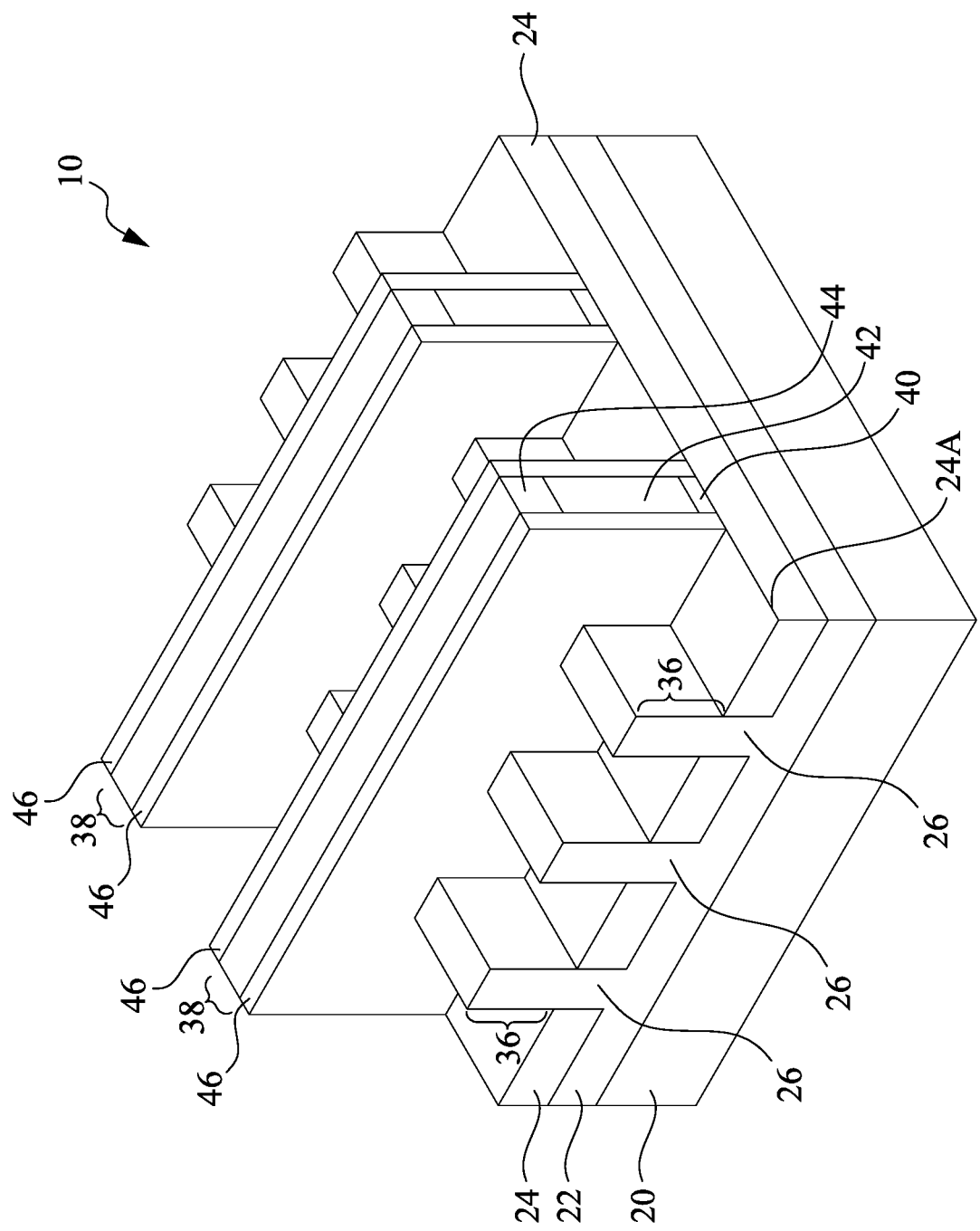

Referring to FIG. 4, dummy gate stacks 38 are formed to extend on the top surfaces and the sidewalls of (protruding) fins 36. The respective process is illustrated as process 408 in the process flow 400 as shown in FIG. 21. Dummy gate stacks 38 may include dummy gate dielectrics 40 (FIG. 7B) and dummy gate electrodes 42 over dummy gate dielectrics 40. Dummy gate electrodes 42 may be formed, for example, using polysilicon or amorphous silicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 as shown in FIG. 21. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
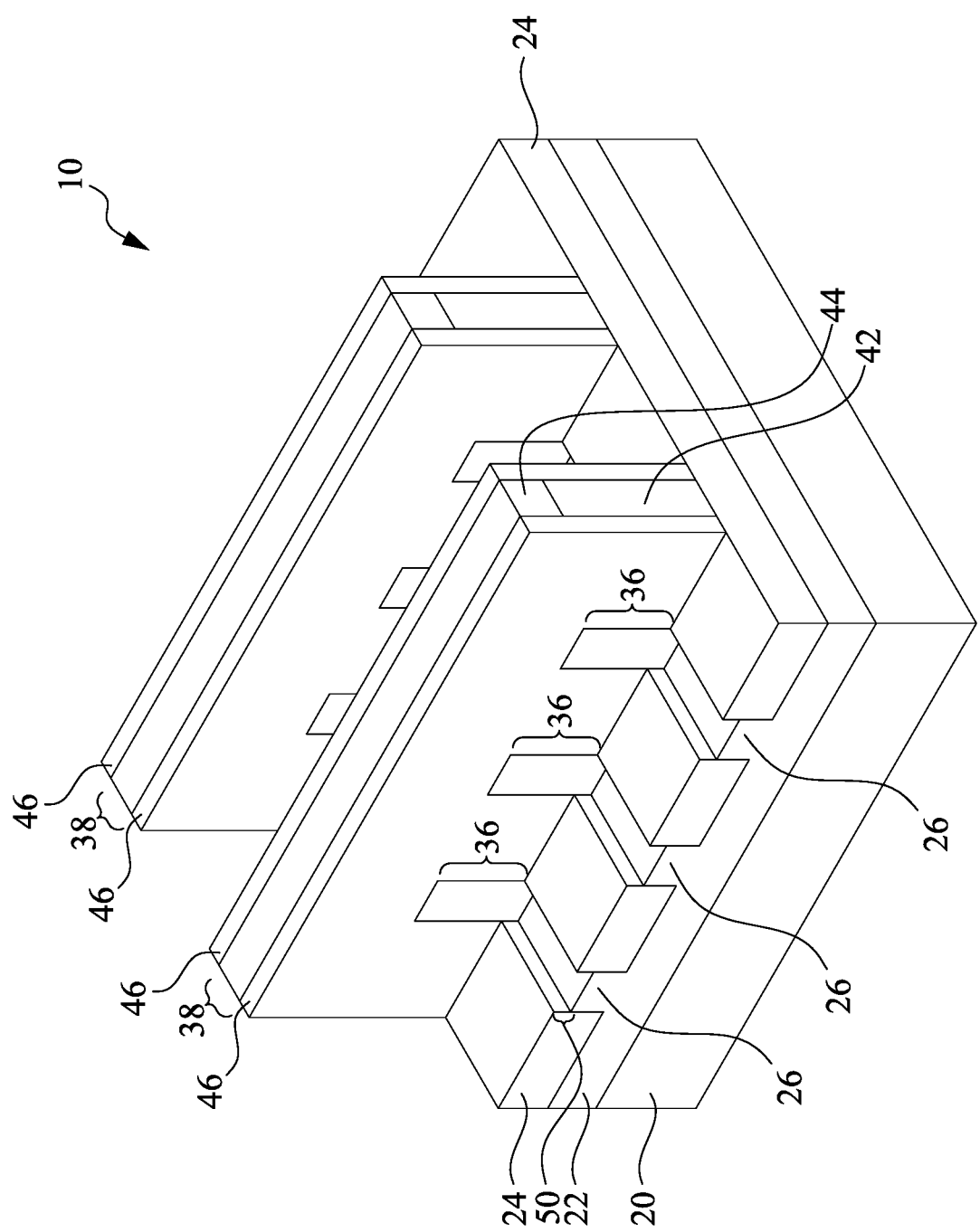

An etching process is then performed to etch the portions of protruding fins 36 that are not covered by dummy gate stacks 38 and gate spacers 46, resulting in the structure shown in FIG. 5. The respective process is illustrated as process 410 in the process flow 400 as shown in FIG. 21. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
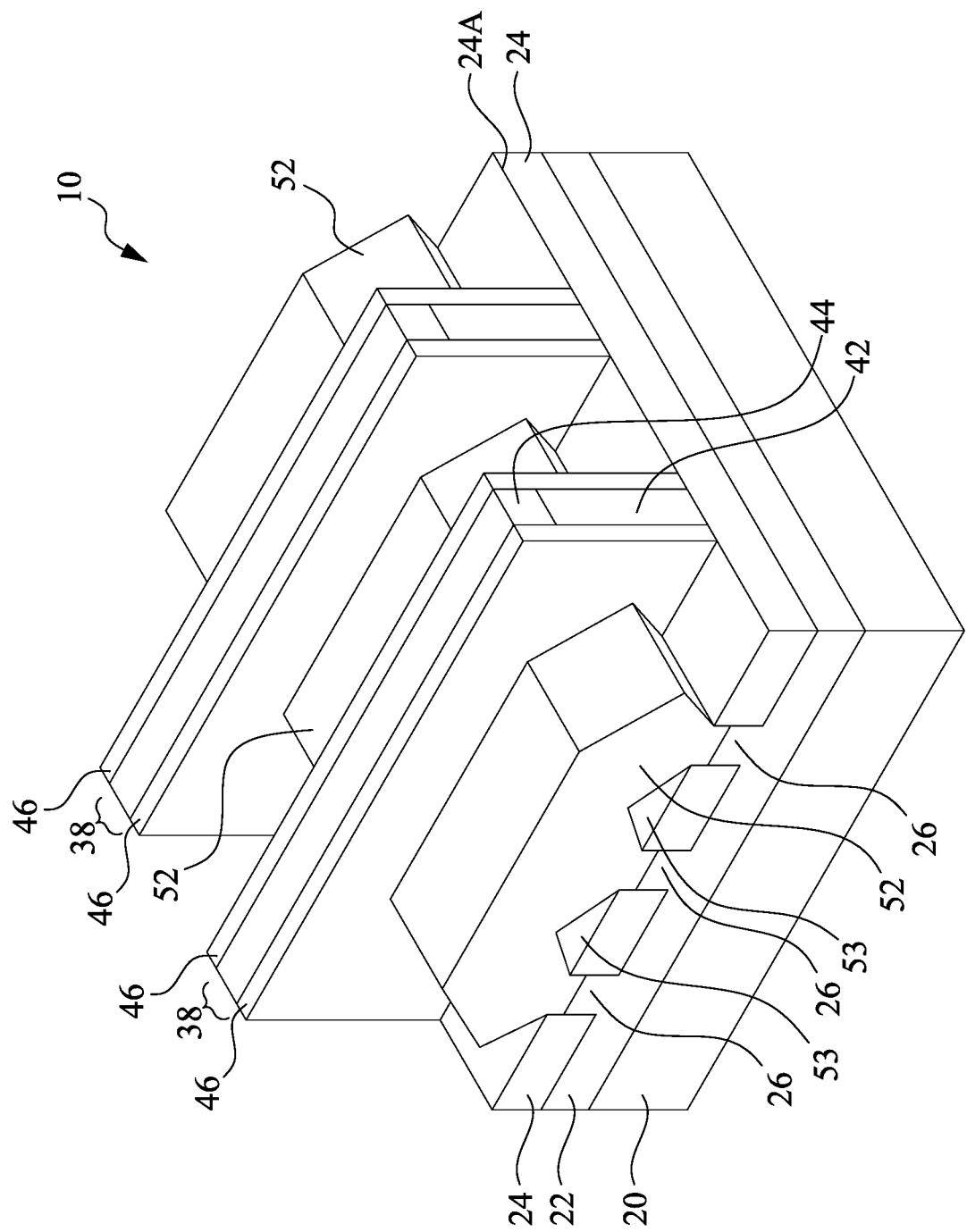

Next, epitaxy regions (source/drain regions) 52 are formed by selectively growing (through epitaxy) a semiconductor material in recesses 50, resulting in the structure in FIG. 6. The respective process is illustrated as process 412 in the process flow 400 as shown in FIG. 21. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. After Recesses 50 are filled with epitaxy regions 52, the further epitaxial growth of epitaxy regions 52 causes epitaxy regions 52 to expand horizontally, and facets may be formed. The further growth of epitaxy regions 52 may also cause neighboring epitaxy regions 52 to merge with each other. Voids (air gaps) 53 may be generated.

After the epitaxy process, epitaxy regions 52 may be further implanted with a p-type or an n-type impurity to form source and drain regions, which are also denoted using reference numeral 52. In accordance with alternative embodiments of the present disclosure, the implantation process is skipped when epitaxy regions 52 are in-situ doped with the p-type or n-type impurity during the epitaxy.

Figure 7A:
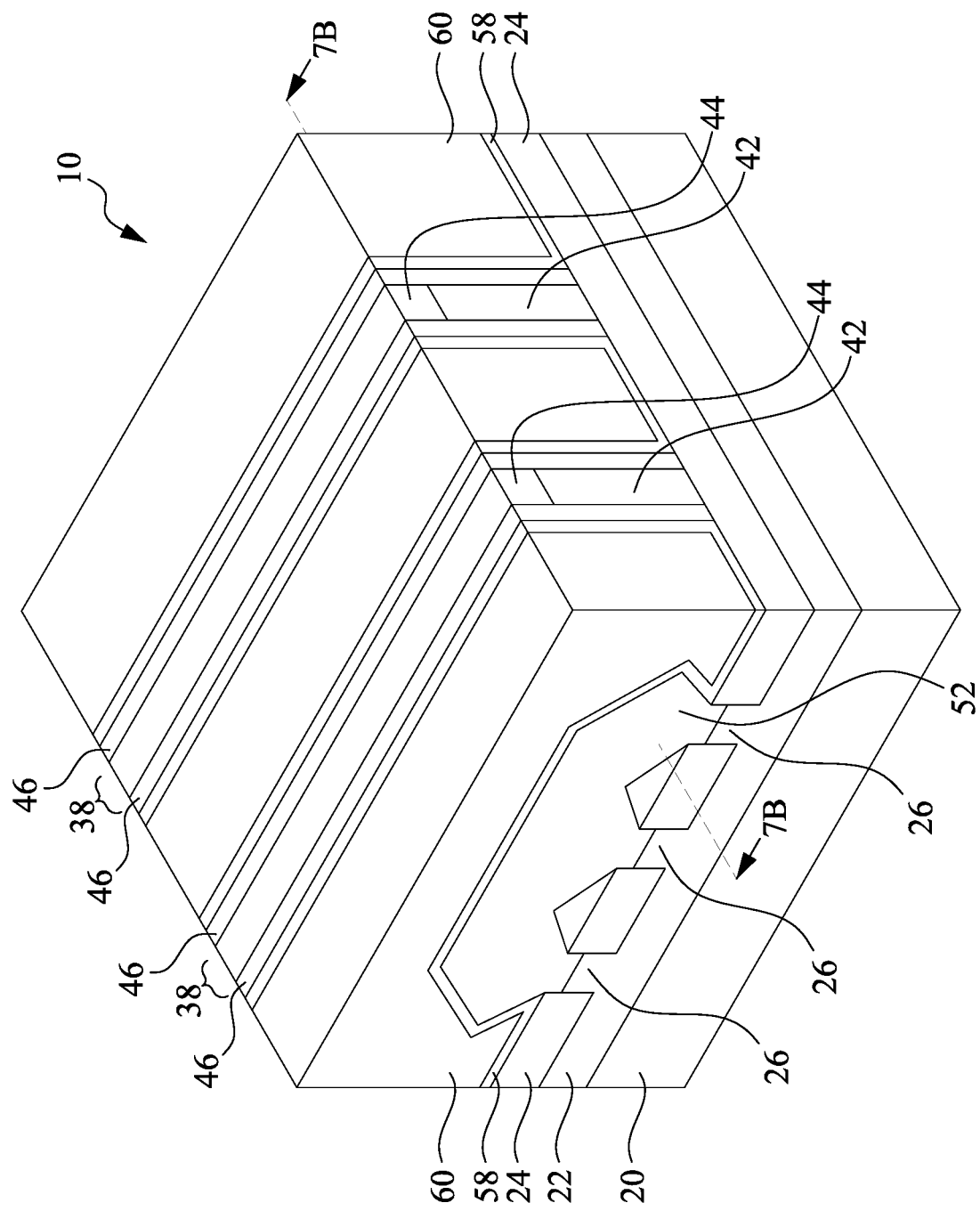

FIG. 7A illustrates a perspective view of the structure after the formation of Contact Etch Stop Layer (CESL) 58 and Inter-Layer Dielectric (ILD) 60. The respective process is illustrated as process 414 in the process flow 400 as shown in FIG. 21. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
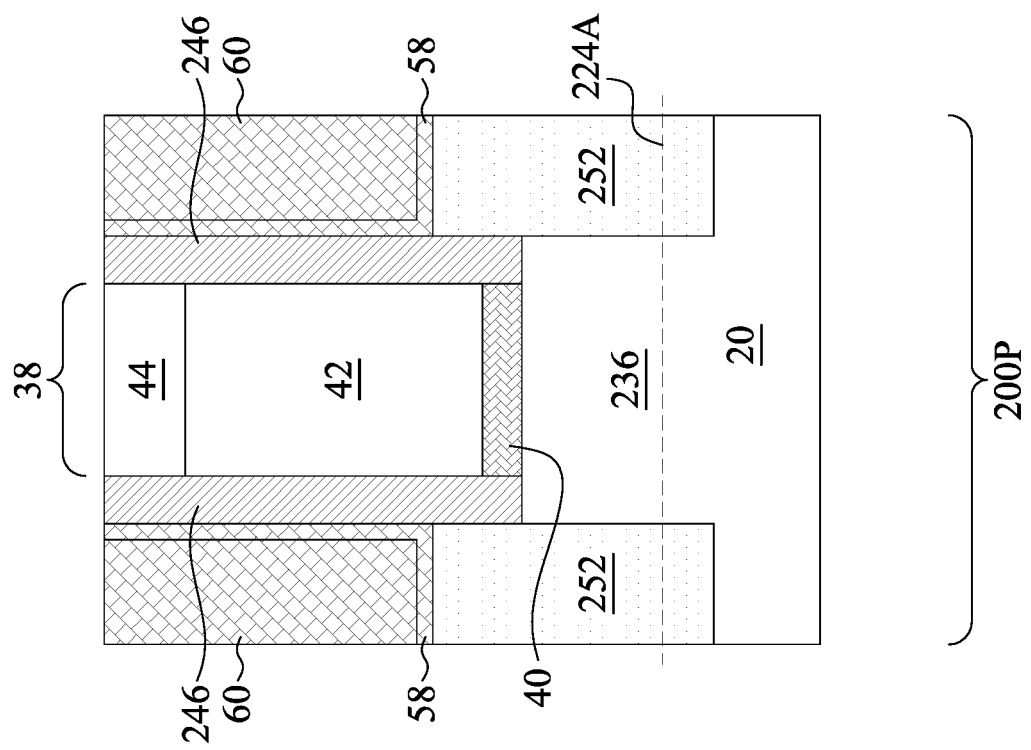
Figure 7B:
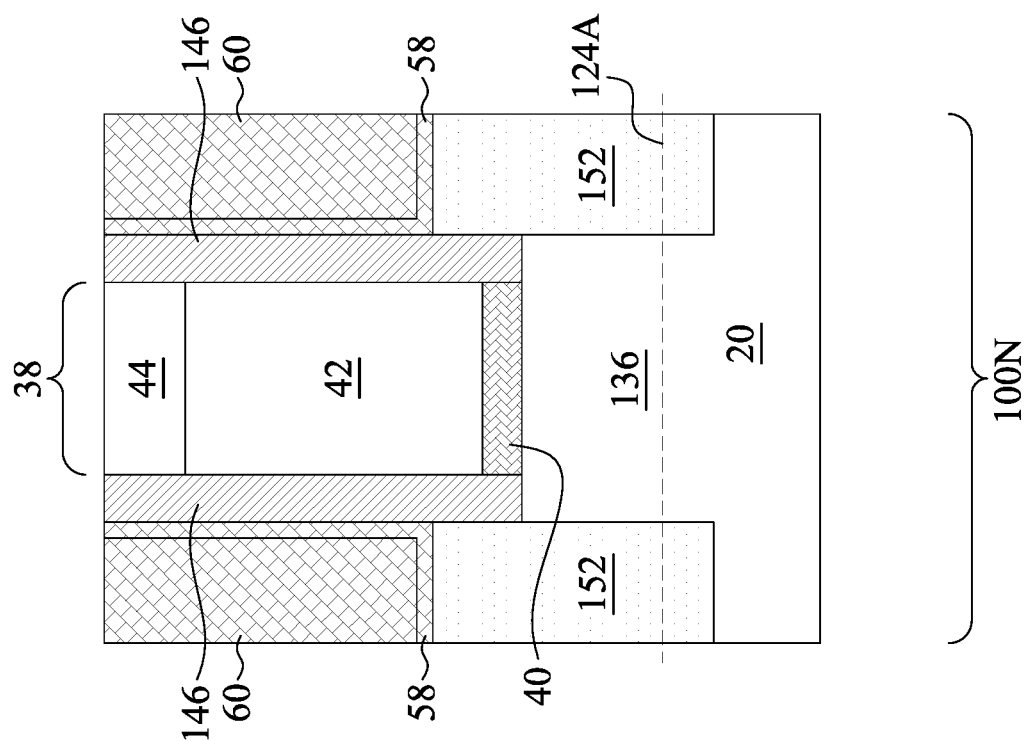

FIG. 7B illustrates the cross-sectional views of intermediate structures in the formation of an n-type FinFET and a p-type FinFET. Either one of the cross-sectional views of the n-type FinFET and the p-type FinFET may correspond to the cross-sectional view obtained from the vertical plane containing line 7B-7B in FIG. 7A. The n-type FinFET is formed in device region 100N, and the p-type FinFET is formed in device region 200P. To distinguish the features in the N-type FinFET from the features in the p-type FinFET, the features in the N-type FinFET may be represented using the reference numerals of the corresponding features in FIG. 7A plus number 100, and the features in the p-type FinFET may be represented using the reference numerals of the corresponding features in FIG. 7A plus number 200. For example, the source/drain regions 152 and 252 in FIG. 7B correspond to source/drain regions 52 in FIG. 7A, and gate spacers 146 and 246 in FIG. 7B correspond to the gate spacers 46 in FIG. 7A. The corresponding features in the n-type FinFET and the p-type FinFET may be formed in common processes.

After the structure shown in FIGS. 7A and 7B is formed, the dummy gate stacks including hard mask layers 44, dummy gate electrodes 42, and dummy gate dielectrics 40 are replaced with metal gates and replacement gate dielectrics, as shown in the processes shown in FIGS. 8 through 16. In FIGS. 8 through 16, the top surfaces 124A and 224A of STI regions 24 are illustrated, and semiconductor fins 136 and 236 protrude higher than the top surfaces 124A and 224A, respectively.

Figure 8:
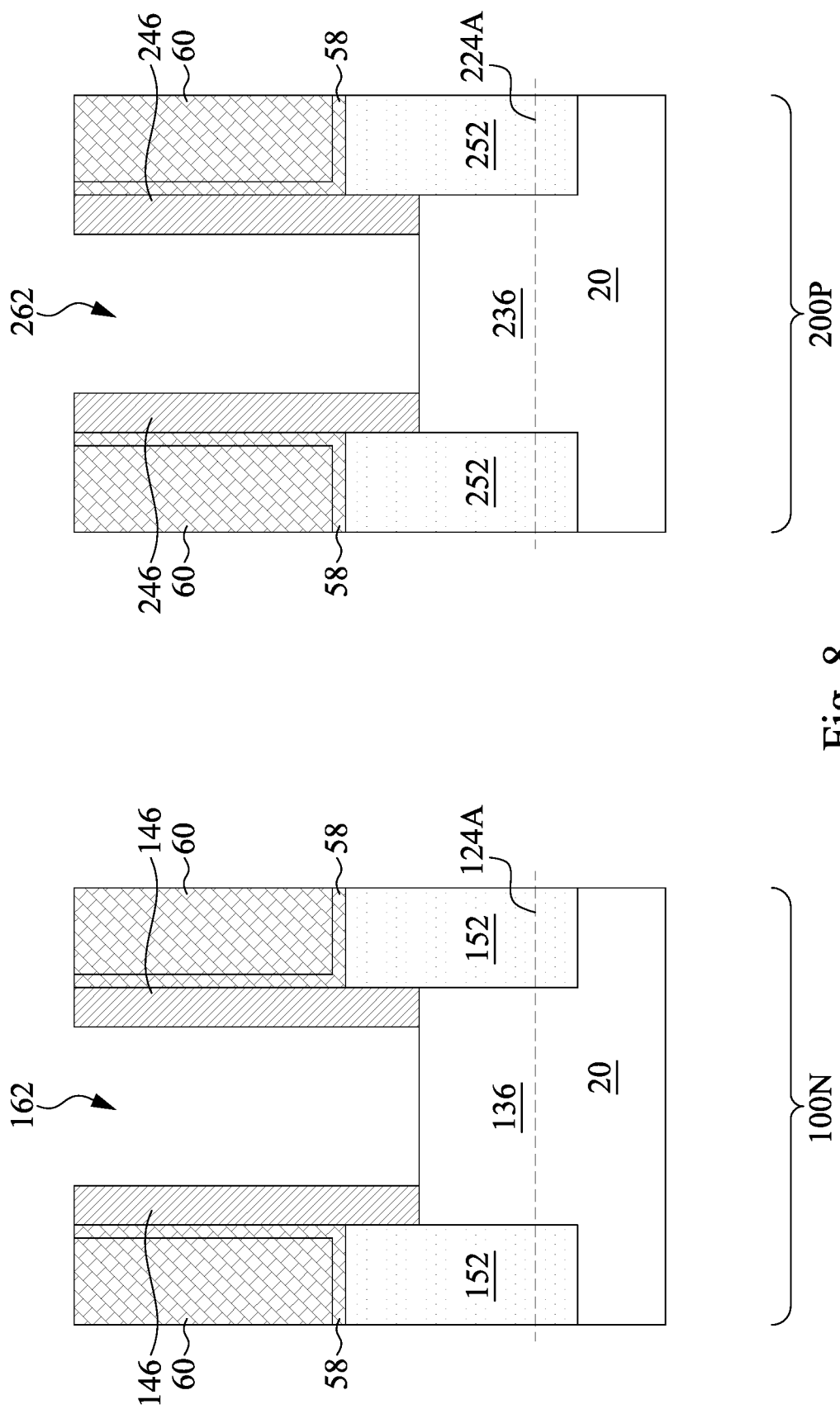

To form the replacement gates, hard mask layers 44, dummy gate electrodes 42, and dummy gate dielectrics 40 as shown in FIGS. 7A and 7B are removed, forming trenches 162 and 262 as shown in FIG. 8. The respective process is illustrated as process 416 in the process flow 400 as shown in FIG. 21. The top surfaces and the sidewalls of protruding fins 136 and 236 are exposed to trenches 162 and 262, respectively.

Figure 9:
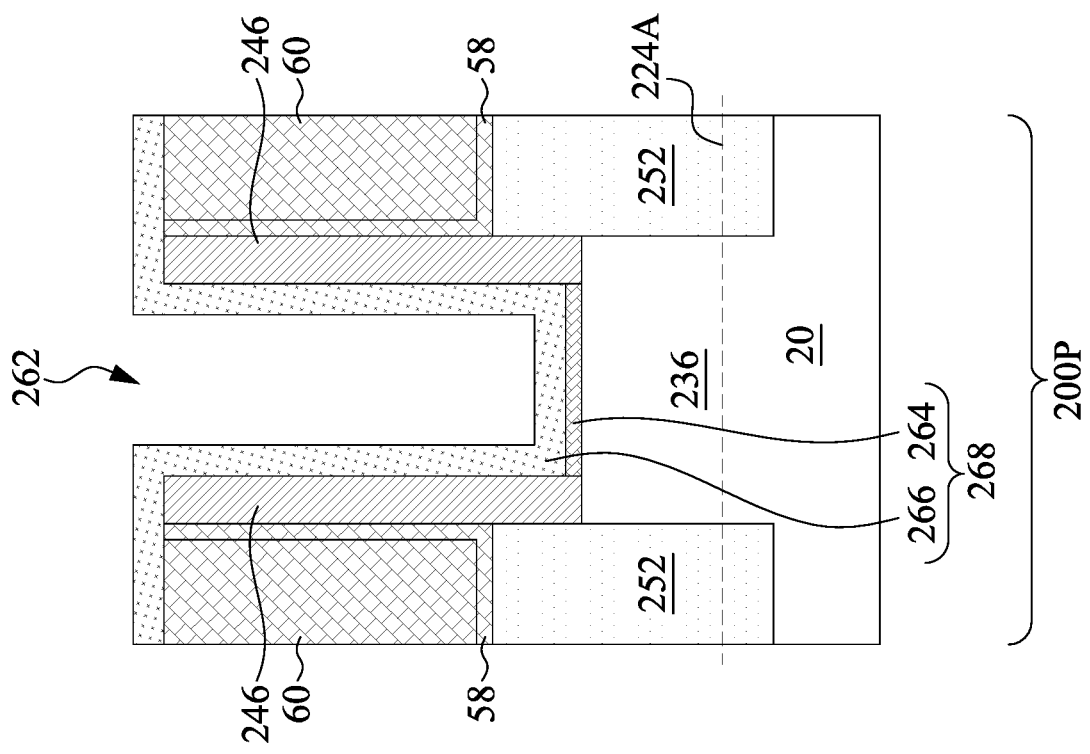
Figure 9:
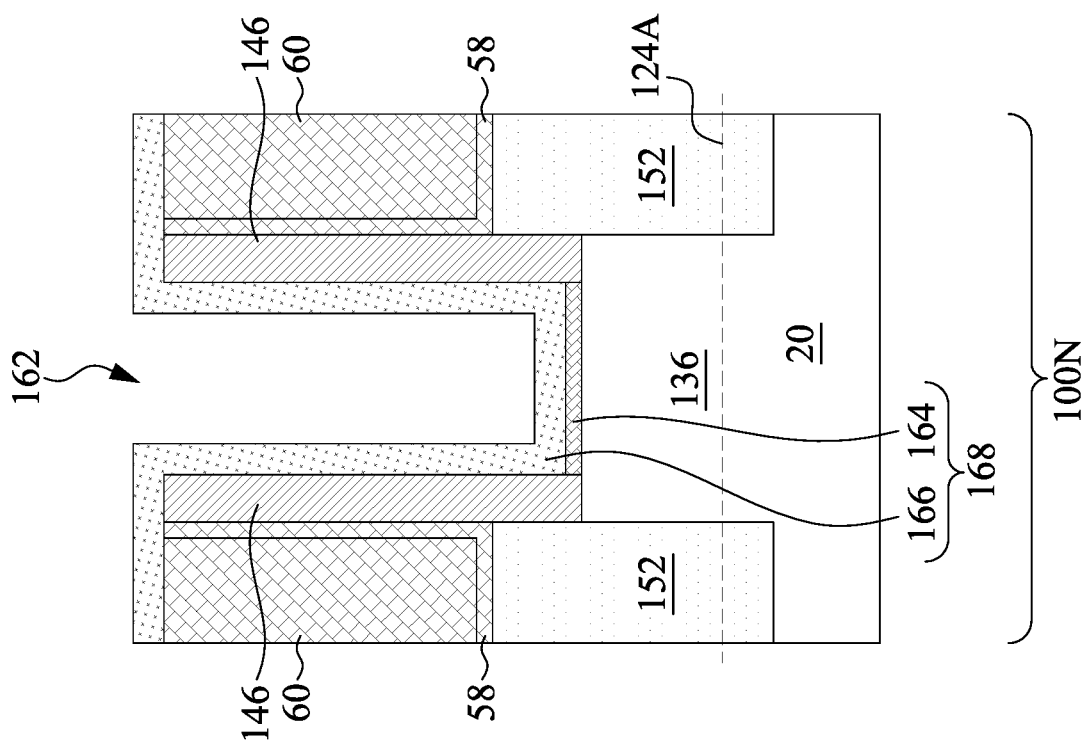

Next, referring to FIG. 9, gate dielectrics 168 and 268 are formed, which extend into trenches 162 and 262, respectively. The respective process is illustrated as process 418 in the process flow 400 as shown in FIG. 21. In accordance with some embodiments of the present disclosure, the gate dielectrics include Interfacial Layers (ILs) 164 and 264, which are formed on the exposed surfaces of protruding fins 136 and 236, respectively. ILs 164 and 264 may include oxide layers such as silicon oxide layers, which are formed through the thermal oxidation of protruding fins 136 and 236, a chemical oxidation process, or a deposition process. The gate dielectrics may also include high-k dielectric layers 166 and 266 over the corresponding ILs 164 and 264. High-k dielectric layers 166 and 266 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0 or higher. High-k dielectric layers 166 and 266 are formed as conformal layers, and extend on the sidewalls of protruding fins 136 and 236 and the top surfaces and the sidewalls of gate spacers 146 and 246, respectively. In accordance with some embodiments of the present disclosure, high-k dielectric layers 166 and 266 are formed using ALD or CVD.

Figure 10:
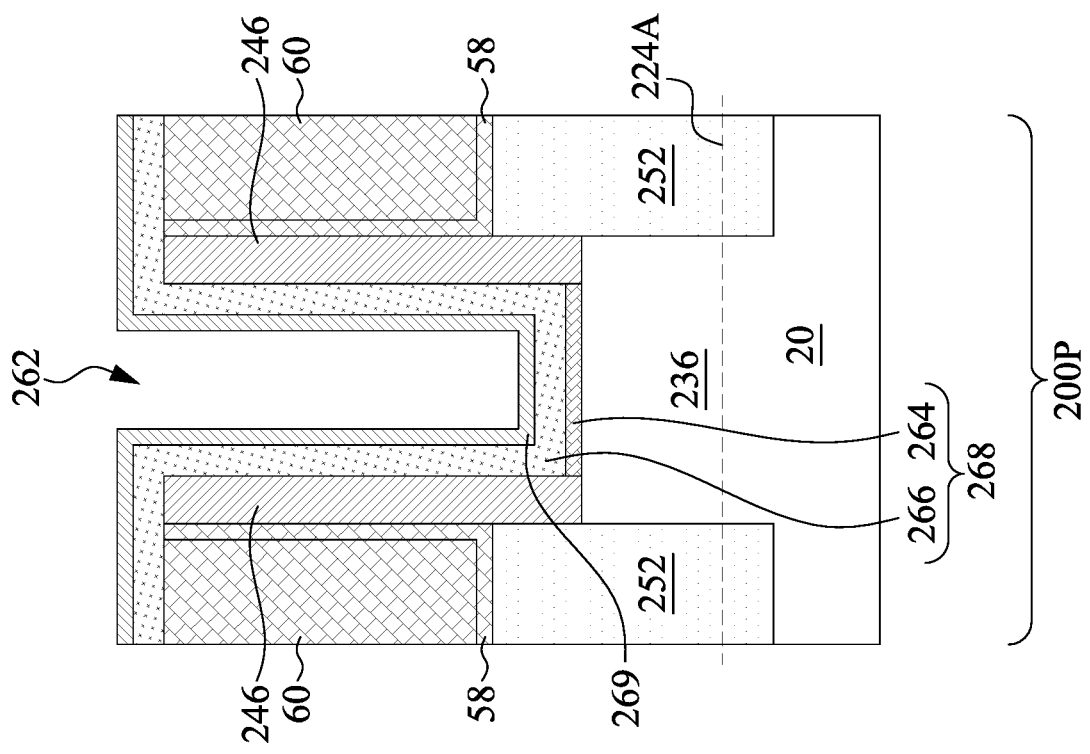
Figure 10:
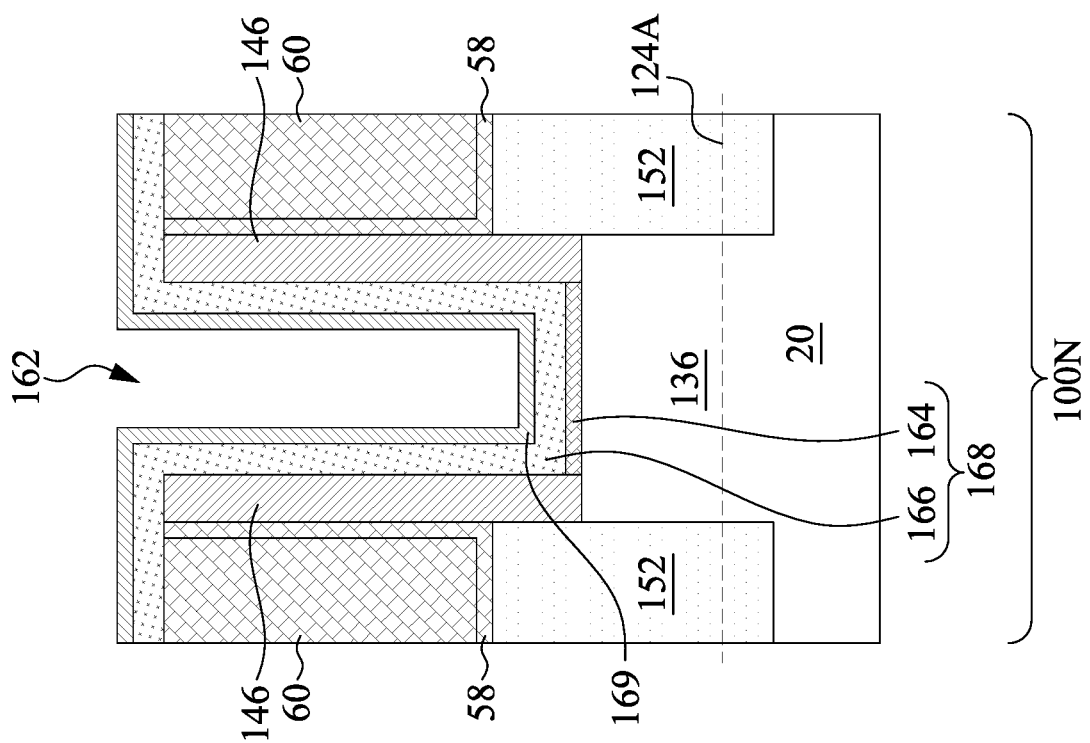

Further referring to FIG. 10, p-type work function layers 169 and 269 are deposited. The respective process is illustrated as process 420 in the process flow 400 as shown in FIG. 21. P-type work function layers 169 and 269 are formed through deposition, and are deposited simultaneously. The deposition may be performed using a conformal deposition method such as ALD or CVD, so that the horizontal thickness of the horizontal portions and vertical thickness of the vertical portions of p-type work function layer 269 are equal to each other or substantially equal to each other, for example, with a variation smaller than about 10 percent. In accordance with some embodiments of the present disclosure, p-type work function layers 169 and 269 extend into trenches 162 and 262, respectively, and include some portions over ILD 60.

P-type work function layers 169 and 269 may be formed of a p-type work function material such as TiN, TaN, TiAlN, WCN, MOON, or the combinations thereof. In accordance with some embodiments of the present disclosure, each of p-type work function layers 169 and 269 is a single layer formed of a homogeneous material such as TiN or other above-recited materials.

Figure 11:
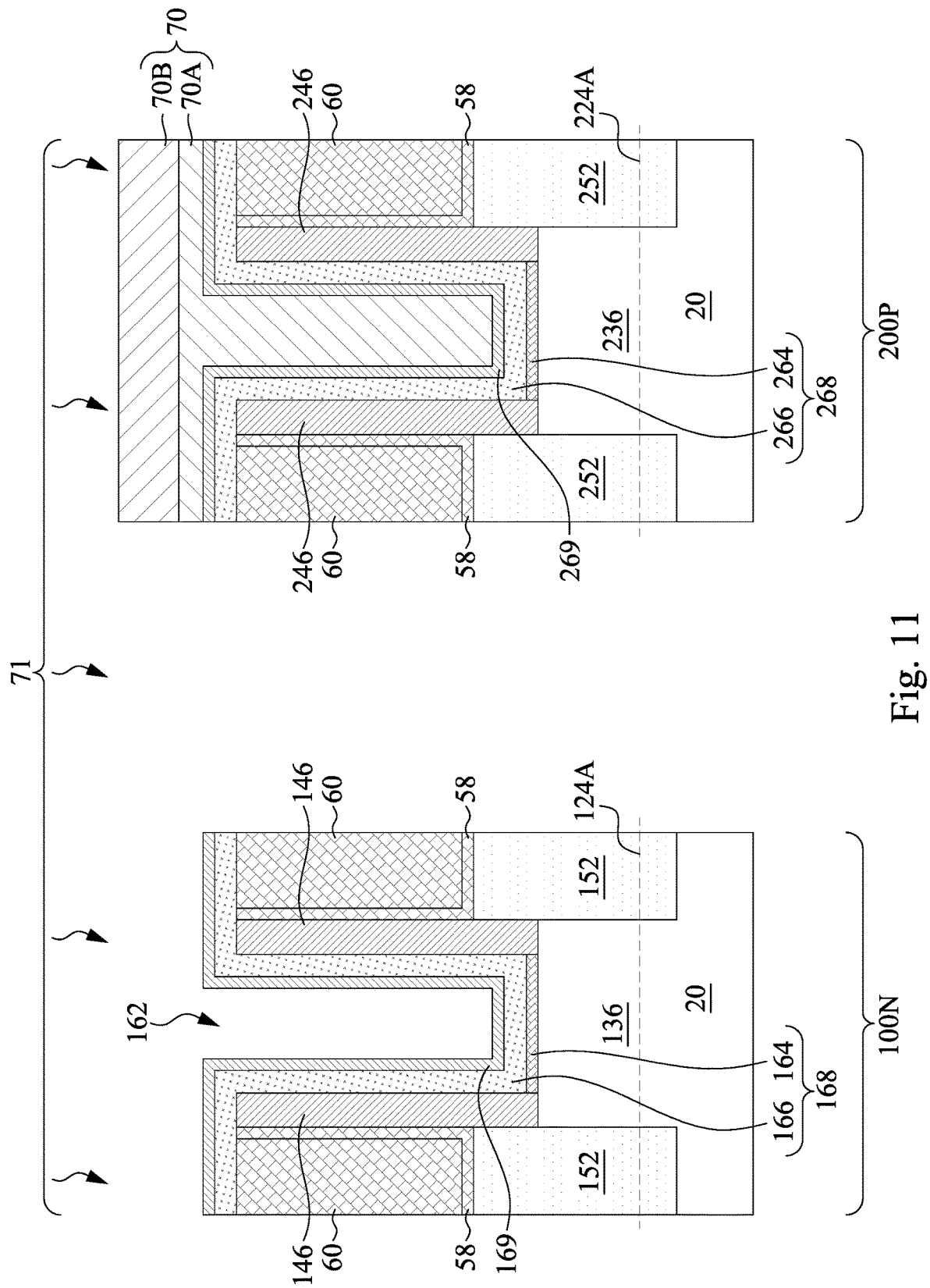

Referring to FIG. 11, etching mask 70 is formed on p-type work function layers 169 and 269. Etching mask 70 may include Bottom Anti-Reflective Coating (BARC) 70A, and photo resist 70B over BARC 70A. The respective process is illustrated as process 422 in the process flow 400 as shown in FIG. 21. In accordance with some embodiments of the present disclosure, BARC 70A is formed of a photo resist, which is cross-linked. Next, photo resist 70B is applied and patterned, so that the portion of photo resist 70B in device region 100N is removed, and the portion of photo resist 70B in device region 200P remains.

In accordance with some embodiments, photo resist 70B is patterned through light-exposure using a lithography mask (not shown), followed by a development process to remove the portion of the photo resist 70B in device region 100N. The portion of BARC 70A in device region 100N is then removed in an etching process, so that the p-type work function layer 169 is exposed.

Figure 12:
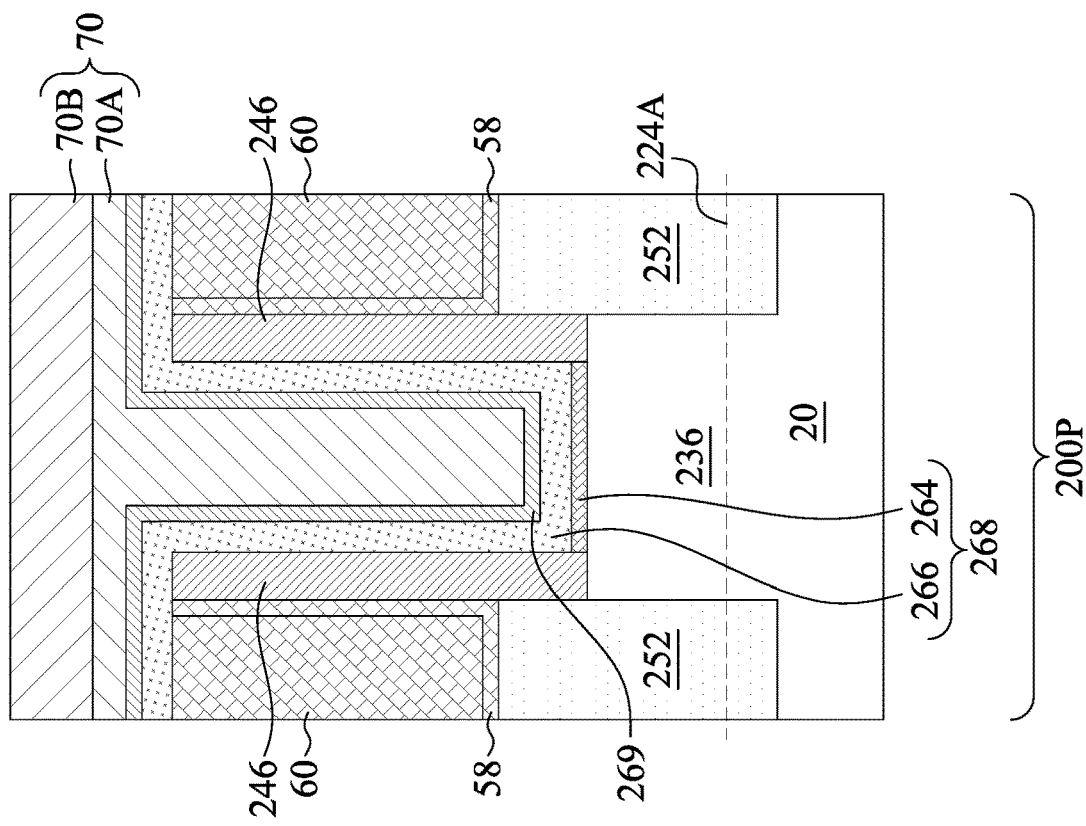
Figure 12:
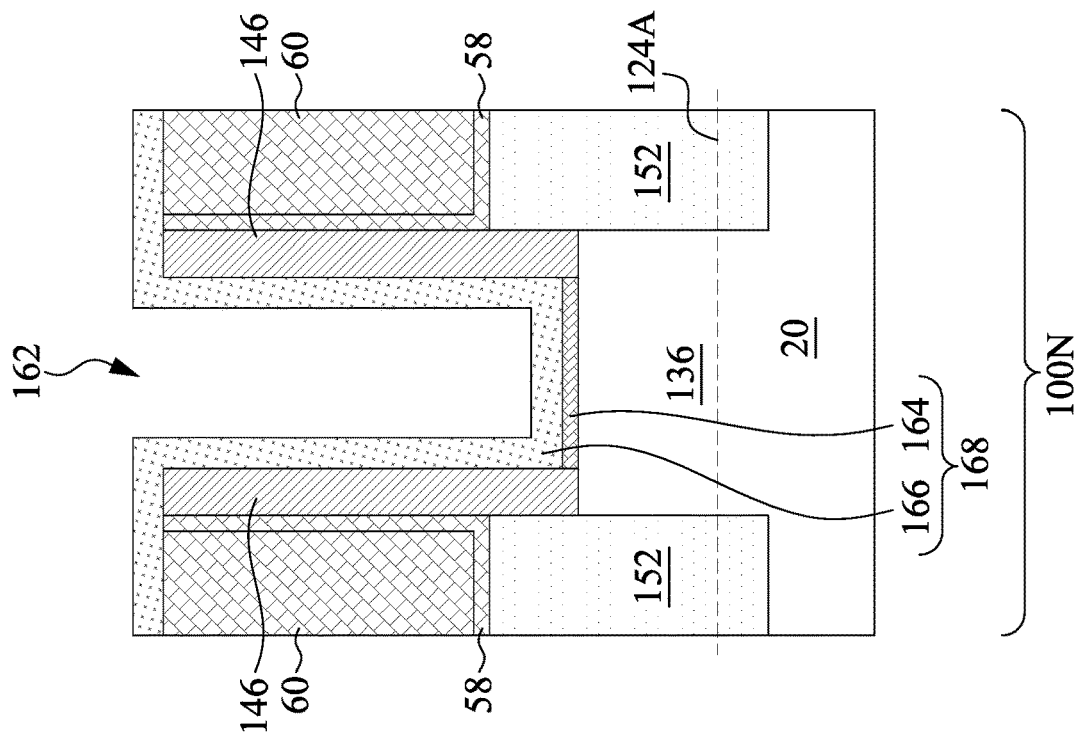
Figure 13:
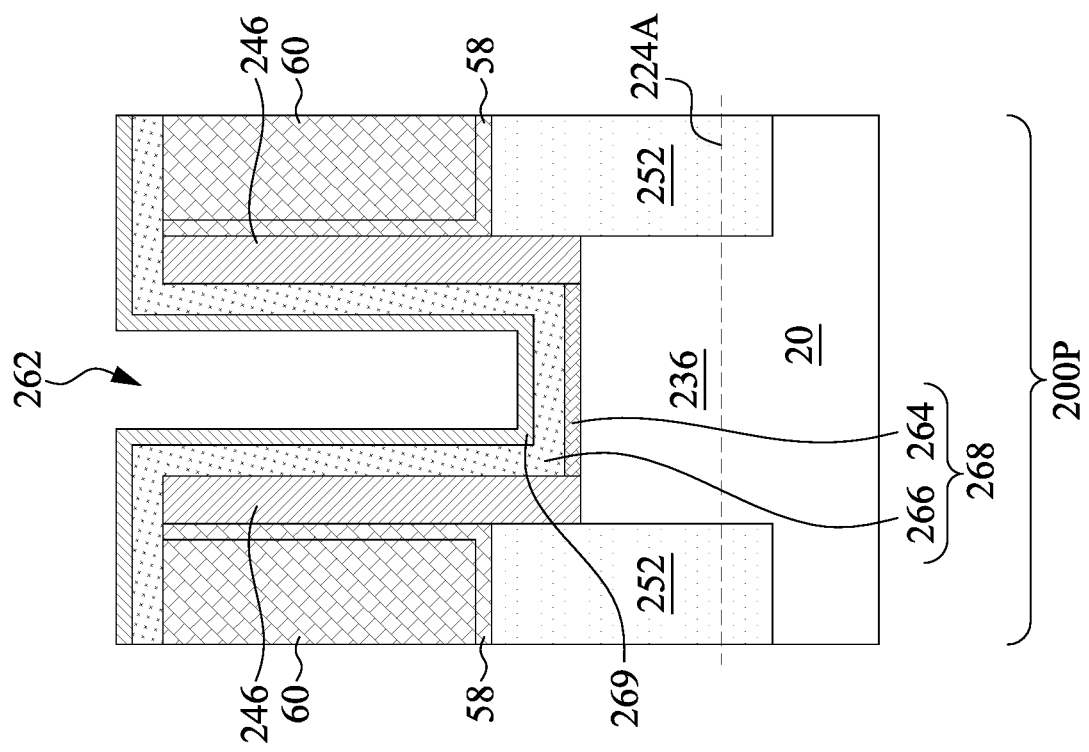
Figure 13:
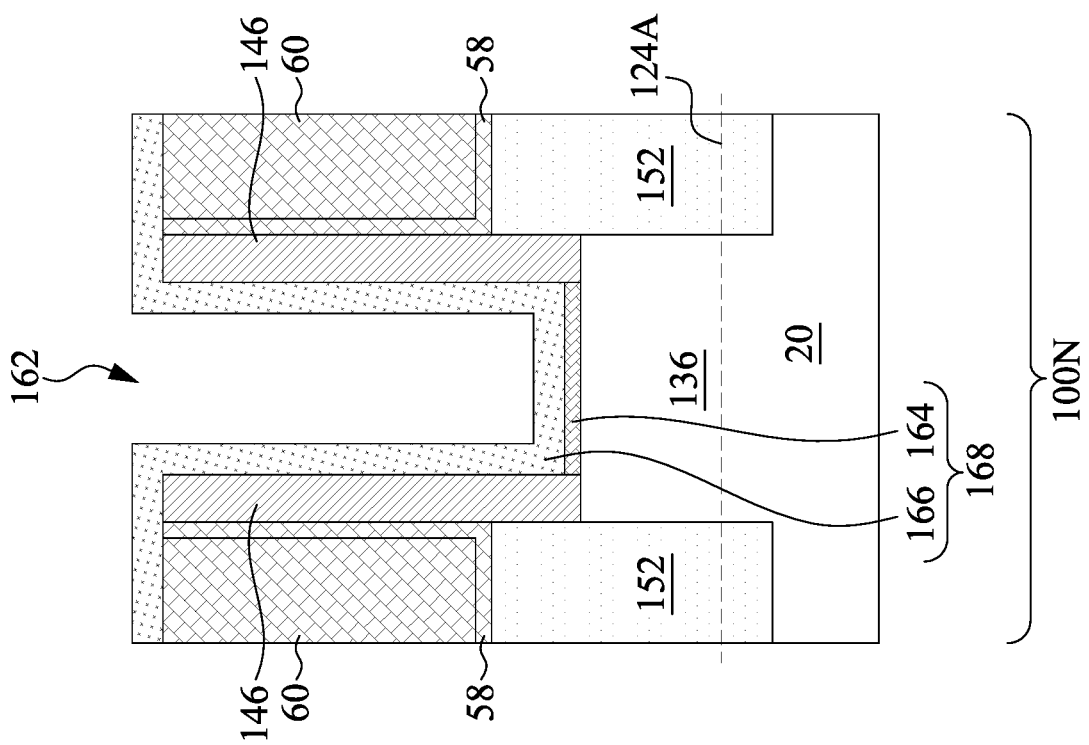

An etching process 71 is then performed to etch p-type work function layer 169. As a result, high-k dielectric layer 166 is revealed. The respective process is illustrated as process 424 in the process flow 400 as shown in FIG. 21. The resulting structure is shown in FIG. 12. Photo resist and/or BARC 70A are used as an etching mask to protect p-type work function layer 269 during the etching process. In accordance with some embodiments of the present disclosure, the etching process is performed through wet etching. For example, when p-type work function layer 169 is formed of TiN, the etching chemical may include a chemical solution including ammonia ($NH_3$), hydrogen peroxide ($H_2O_2$), and water. In accordance with alternative embodiments, a dry etching process may be used. After the etching process, etching mask 70 is removed, and p-type work function layer 269 is exposed, as shown in FIG. 13. The respective process is illustrated as process 426 in the process flow 400 as shown in FIG. 21.

Figure 14:
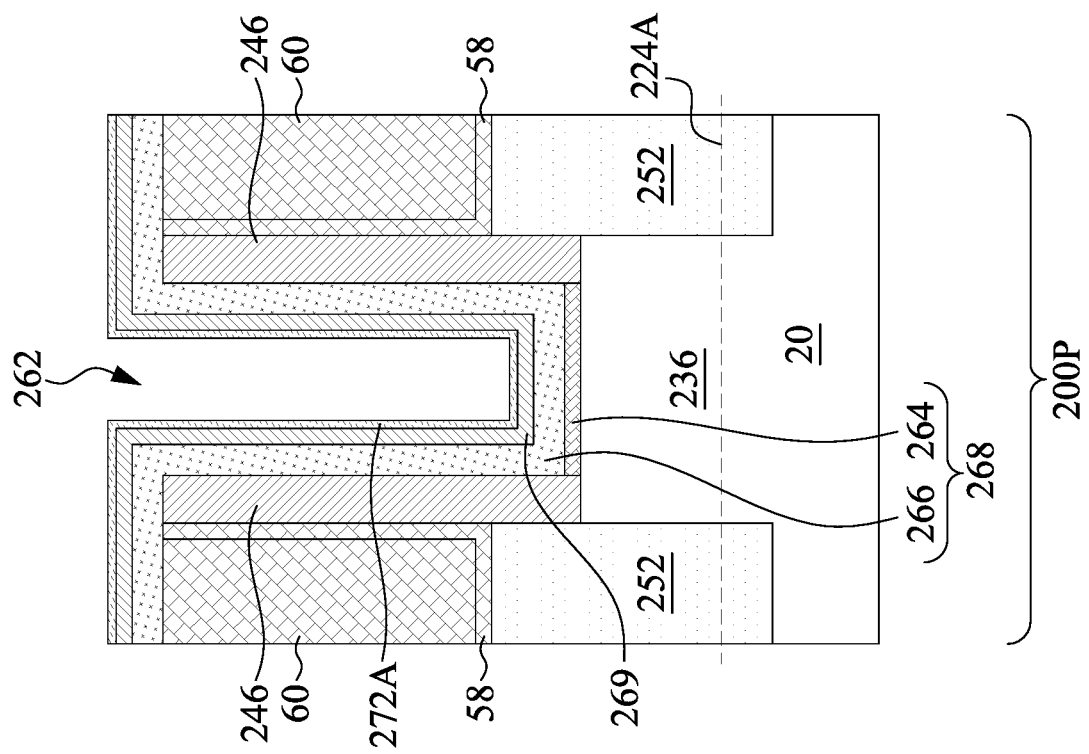
Figure 14:
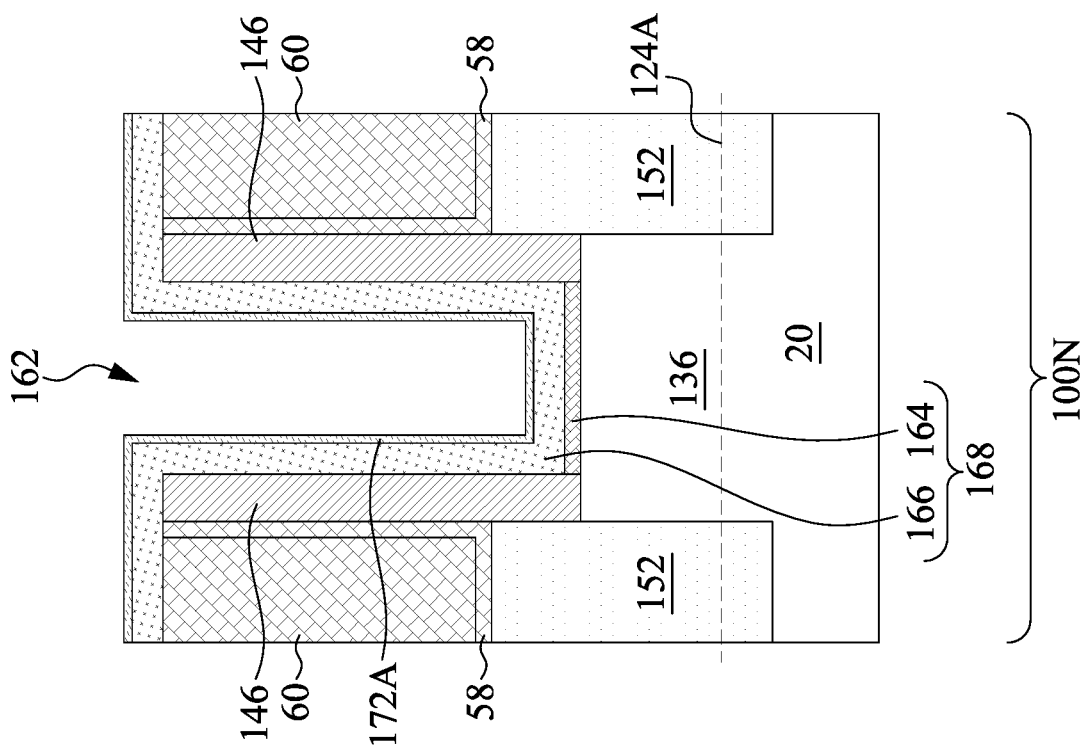

FIG. 14 illustrates the deposition of n-type work function layers 172A and 272A in a common deposition process. Throughout the description, the deposition process of n-type work function layers 172A and 272A is referred to as a first deposition process of the work function layer. The respective process is illustrated as process 428 in the process flow 400 as shown in FIG. 21. The deposition of n-type work function layers 172A and 272A is performed using a first precursor. In accordance with some embodiments, the deposition of n-type work function layers 172A and 272A is performed using ALD process or CVD process. The first precursor may include a metal-containing precursor and an aluminum-containing precursor. The metal-containing precursor may include $TiCl_4$, $TaCl_5$, or the like. The aluminum-containing precursor may include one of, but not both of, triethylaluminum (TEA) and tritertbutylaluminum (TTBA). The resulting n-type work function layers 172A and 272A are either TiAlC or TaAlC layers, depending on the metal-containing precursor. When ALD is adopted, an ALD cycle includes pulsing the metal-containing precursor, purging the metal-containing precursor, pulsing the aluminum-containing precursor, and purging aluminum-containing precursor. The deposition of n-type work function layers 172A and 272A may include a single ALD cycle only, or a plurality of ALD cycles.

In accordance with some embodiments, the ALD process is performed at a temperature in a range between about 300° C. and about 500° C., the pressure of the precursors may be in the range between about 0.5 Torr and about 40 Torr. The deposition rate of the ALD process, which is the deposited thickness per ALD cycle (referred to as per-cycle-thickness hereinafter) may be in the range between about 2 Å and about 10 Å. The deposition rate is affected by various factors, which include, and are not limited to, the wafer temperature, the type of the precursor, and the like. The deposition rate may also increase when the wafer temperature increases. For example, when $TiCl_4$ and TEA are used as the precursors, the deposition rate is about 1.89 Å per ALD cycle when the wafer temperature is 300° C., 3.85 Å per ALD cycle when the wafer temperature is 360° C., and 10.29 Å per ALD cycle when the wafer temperature is 450° C. When $TiCl_4$ and TTBA are used as the precursors, the deposition rate is about 0.9 Å per ALD cycle when the wafer temperature is 300° C., around 1.5 Å per ALD cycle when the wafer temperature is 360° C., and around 2.0 Å per ALD cycle when the wafer temperature is 450° C.

Figure 15:
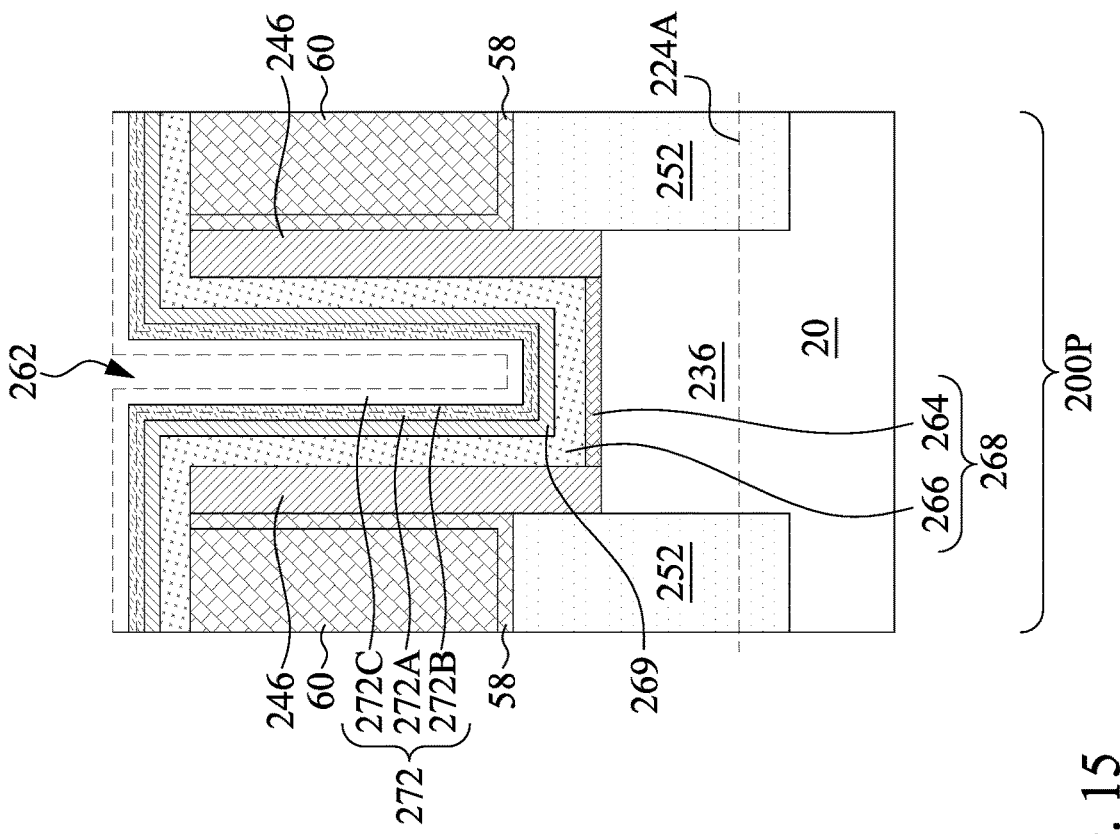
Figure 15:
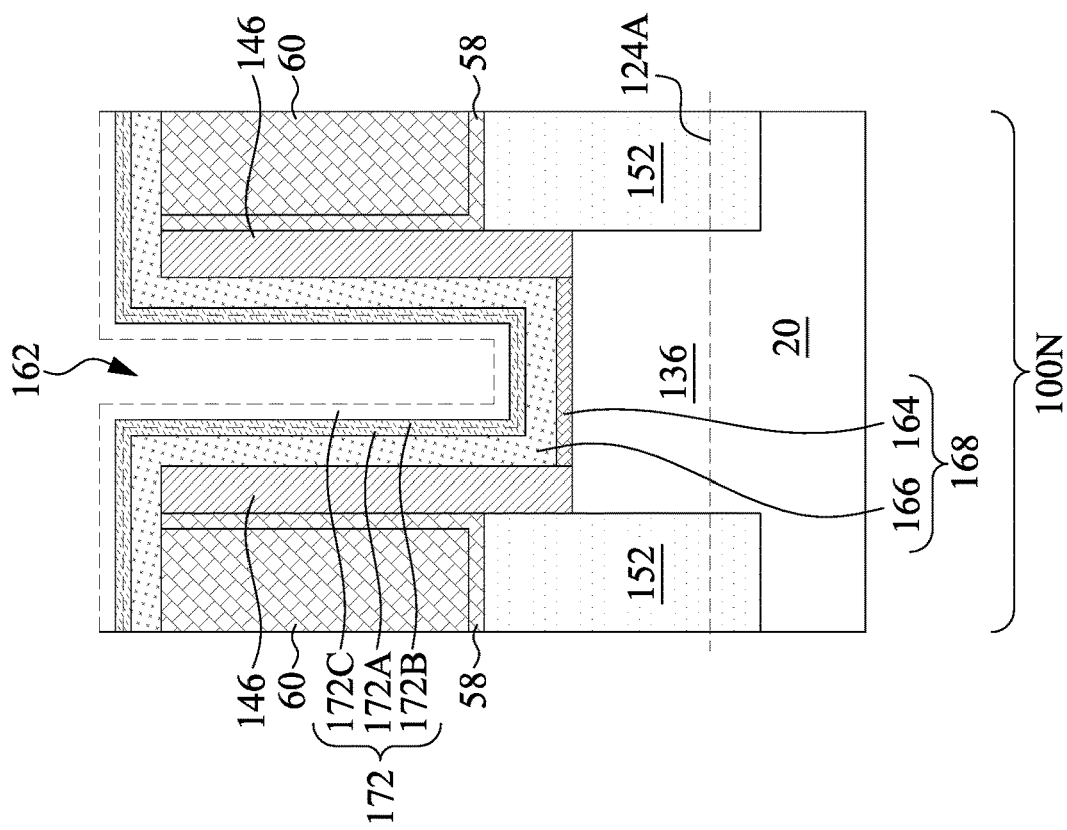

FIG. 15 illustrates the deposition of n-type work function layers 172B and 272B. Throughout the description, the deposition process of n-type work function layers 172B and 272B is referred to as a second deposition process of the work function layer. The respective process is illustrated as process 430 in the process flow 400 as shown in FIG. 21. N-type work function layers 172B and 272B may be formed of or include the same elements (such as Ti, Al, and C) as n-type work function layers 172A and 272A. The atomic percentages of the elements in n-type work function layers 172B and 272B, however, are different from the atomic percentages of the corresponding elements in n-type work function layers 172A and 272A. Throughout the description, when two materials have different elements or have the same elements but have different atomic percentages, the two materials are referred to as having different compositions. For example, the atomic percentage of aluminum in n-type work function layers 172B and 272B may be lower than the atomic percentage of aluminum in n-type work function layers 172A and 272A. Throughout the description, n-type work function layers 172A and 172B are collectively referred to as n-type work function layers 172, and n-type work function layers 272A and 272B are collectively referred to as n-type work function layers 272.

The second deposition process of the n-type work function layer is performed using a second precursor different from the first precursor used in the first deposition process. In accordance with some embodiments, the second deposition process is performed using an ALD process or a CVD process. In accordance with some embodiments, the second precursor may include a metal-containing precursor and an aluminum-containing precursor. The metal-containing precursor may include $TiCl_4$, $TaCl_5$, or the like. Furthermore, the metal-containing precursor in the second precursor may be the same as, or different from, the metal-containing precursor in the first precursor, for example, when $TiCl_4$ is used in the first precursor, $TiCl_4$ or $TaCl_4$ may be used as the second precursor. The aluminum-containing precursor may include one of, but not both of, TTBA and Trimethylaluminum (TMA) in accordance with some embodiments. The resulting n-type work function layers 172B and 272B are TiAlC or TaAlC layers, depending on the precursor. When ALD is adopted, an ALD cycle also includes pulsing the metal-containing precursor, purging the metal-containing precursor, pulsing the aluminum-containing precursor, and purging the aluminum-containing precursor. The deposition of n-type work function layers 172B and 272B may include a single ALD cycle only, or a plurality of cycles.

In accordance with some embodiments, the deposition of n-type work function layers 172B and 272B is in-situ performed with the deposition of n-type work function layers 172A and 272A, with no vacuum break in between. The ALD process may be performed at a temperature in a range between about 300° C. and about 500° C. The pressure of the precursors may be in the range between about 0.5 Torr and about 40 Torr. The deposition rate of the ALD process may be in the range between about 2 Å and about 10 Å. In accordance with some embodiments, When $TiCl_4$ and TMA are used as precursors, the deposition rate is about 1 Å per ALD cycle when the wafer temperature is 300° C., 1.32 Å per ALD cycle when the wafer temperature is 360° C., and 2.06 Å per ALD cycle when the wafer temperature is 450° C. In accordance with some embodiments, the wafer temperature in the second deposition process is the same as the wafer temperature in the first deposition process, so that the deposition may quickly turn from the first deposition process to the second deposition process. In accordance with alternative embodiments, the wafer temperature in the second deposition process is higher than or lower than the wafer temperature in the first deposition process, so that the deposition rates in the first and the second deposition processes may be more accurately tuned through the adjustment of the wafer temperatures.

In accordance with some embodiments, the first precursor for depositing n-type work function layer 172A and depositing n-type work function layer 172B is selected so that the deposition rate (thickness per cycle) of n-type work function layer 172B is smaller than the deposition rate of n-type work function layer 172A (assuming the same wafer temperature is used). It is appreciated that layers 272A and 272B has smaller effect to the work function (and hence the threshold voltage) of the corresponding p-type FinFET than layers 172A and 172B, and hence the properties of layers 272A and 272B may not be mentioned in the following discussion, while their effects are the same as the corresponding layers 172A and 172B. The first and the second precursors may also be selected so that the atomic percentage of aluminum in n-type work function layer 172A (as deposited) is higher than the atomic percentage of aluminum in n-type work function layer 172B (as deposited). For example, as aforementioned, the deposition rate of the TiAlC deposited using TEA (and $TiCl_4$ or $TaCl_5$) is greater than the deposition rate of the TiAlC deposited using TTBA (and $TiCl_4$ or $TaCl_5$), and is further greater than the deposition rate of the TiAlC deposited using TMA (and $TiCl_4$ or $TaCl_5$). In addition, the aluminum atomic percentage in the TiAlC deposited using TEA (and $TiCl_4$ or $TaC5_4$) is greater than the aluminum atomic percentage of TiAlC deposited using TTBA (and $TiCl_4$ or $TaCl_4$), and is further greater than the aluminum atomic percentage of the TiAlC deposited using TMA (and $TiCl_4$ or $TaCl_5$). Accordingly, when TEA is used for depositing n-type work function layer 172A, the precursors for depositing n-type work function layer 172B may include one, but not both, of TTBA or TMA. When TTBA is used for depositing n-type work function layer 172A, the precursor for depositing n-type work function layer 172B may include TMA.

In accordance with some embodiments, the deposition of n-type work function layers 172A and 272A include m ALD cycles, wherein integer m may be equal to 1 or greater, for example, 2, 3, 4, or more. The deposition of n-type work function layers 172B and 272B include n ALD cycles, wherein integer n may be equal to 1 or greater, such as 2, 3, 4, or more. Assuming the deposition rate of n-type work function layers 172A and 272A is DR72A (Å/cycle), and the deposition rate of n-type work function layers 172B and 272B is DR72B (Å/cycle), the total thickness of n-type work function layers 172 (or 272) is (m×DR72A+n×DR72B). Since deposition rate DR72A is different from deposition rate DR72B, the values m and n may be selected to achieve the desirable thickness for n-type work function layers 172 and 272. For example, assuming the wafer temperature is selected as being 360° C., and the desirable thickness is 5 Å, one ALD cycle using $TiCl_4$ and TEA may be performed to form 3.85 Å of TiAlC, followed by one ALD cycle using $TiCl_4$ and TMA to form 1.32 Å of TiAlC. If the desirable thickness is 6 Å, then one ALD cycle using $TiCl_4$ and TEA may be performed to form 3.85 Å of TiAlC, followed by two ALD cycles using $TiCl_4$ and TMA to form 2.64 Å of TiAlC. The wafer temperatures of the first and the second deposition process may also be different from each other to achieve better thickness tuning. In accordance with some embodiments of the present disclosure, the thickness of n-type work function layer 172 is in the range between about 15 Å and about 50 Å, wherein layer 172A may have a thickness in the range between about 20 percent and about 80 percent of the total thickness of layer 172.

In accordance with some embodiments, the TiAlC formed using TEA has a first aluminum atomic percentage (which may be in the range between about 30 percent or about 80 percent), which is higher than a second aluminum atomic percentage (which may be in the range between about 10 percent or about 75 percent), in the TiAlC formed using TTBA. The second aluminum atomic percentage formed using TTBA is further higher than a third aluminum atomic percentage, which may be in the range between about 2 percent or about 10 percent, in the TiAlC formed using TMA. It is appreciated that for improving the performance of the n-type transistor, it is desirable that aluminum has a high atomic percentage at the interface between n-type work function layer 172 and the underlying high-k dielectric layer 166. Accordingly, it is advantageous to form n-type work function layer 172A using TEA (or TTBA) so that a high aluminum atomic percentage is achieved, and more aluminum may be at the interface. On the other hand, to be able to control the total thickness of the n-type work function layer more accurately, n-type work function layer 172B may be formed using a precursor (such as TTBA or TMA) with a lower deposition rate, so that the total thickness of the n-type work function layer may be better controlled. N-type work function layer 172B may also advantageously act as a buffer to isolate the high-aluminum-containing layer from the overlying layers.

Figure 18:
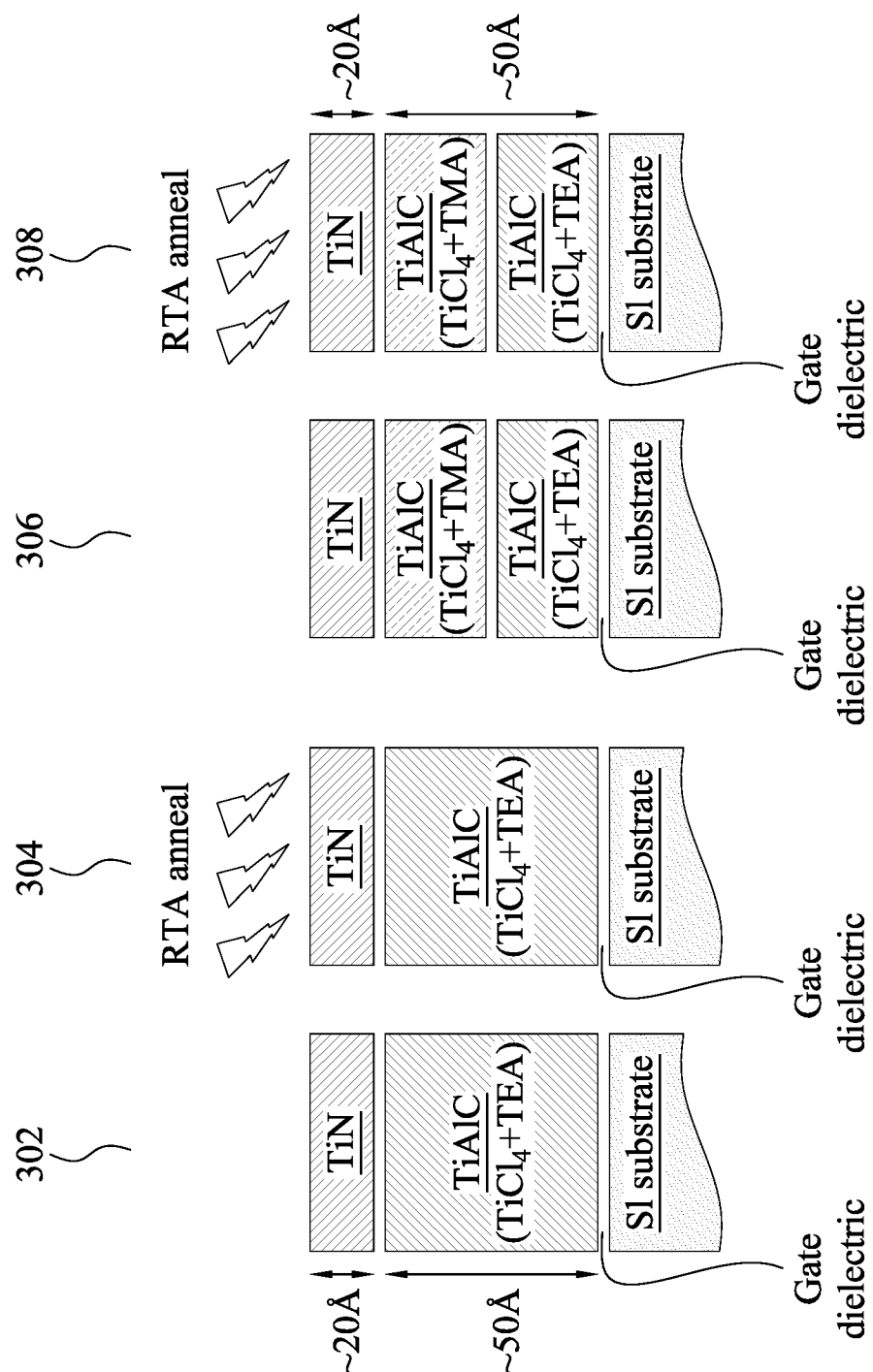
FIG. 18 illustrates the samples having TiAlC layers formed using different methods in accordance with some embodiments.
Figure 19:
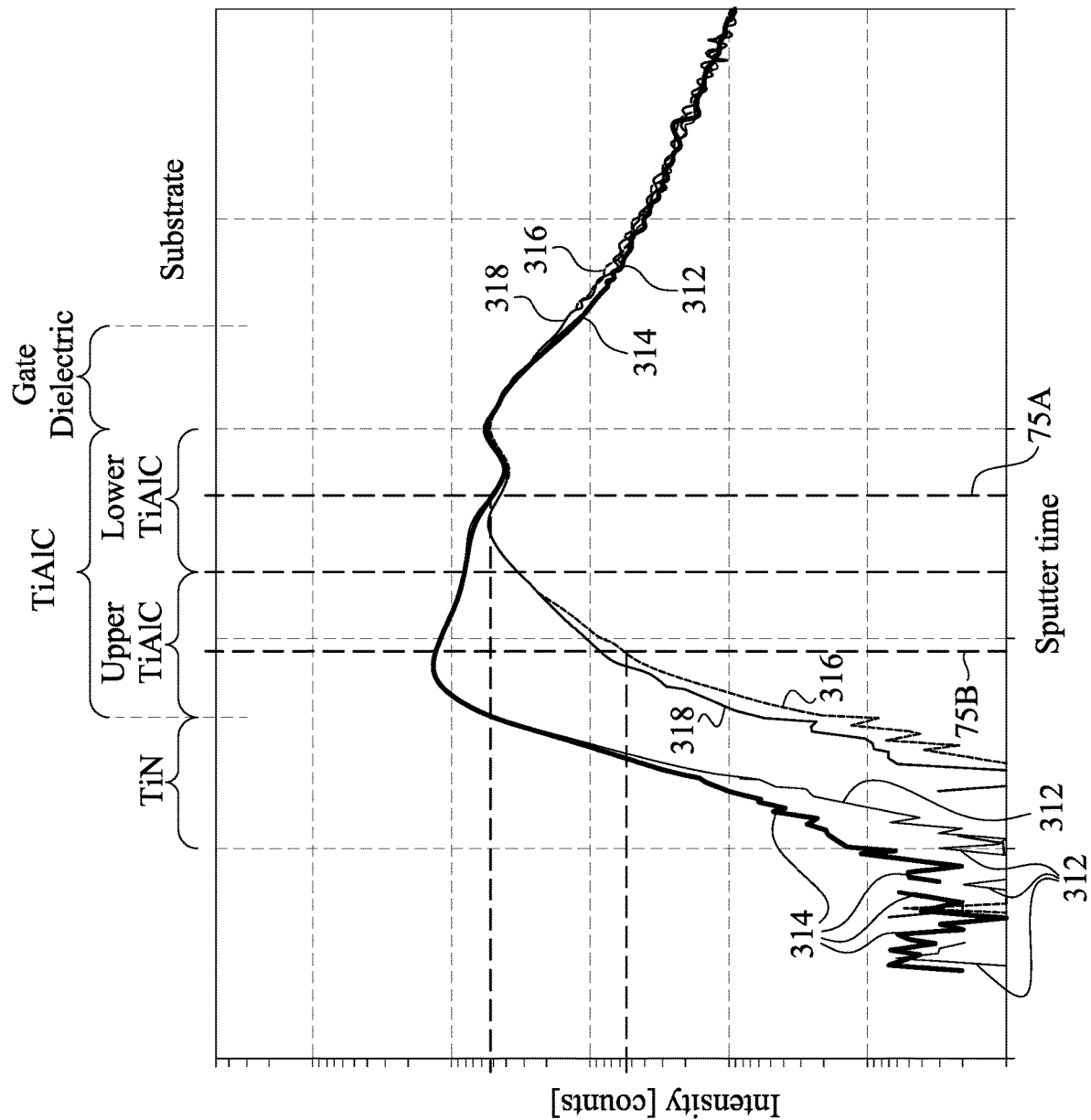
FIG. 19 illustrates the signal intensity of aluminum in the TiAlC samples in accordance with some embodiments.

FIGS. 18 and 19 illustrate a plurality of samples having different work function layers, with some formation processes including annealing processes. FIG. 18 illustrates samples 302, 304, 306, and 308. Sample 302 includes a silicon substrate, a gate dielectric over the silicon substrate, a TiAlC layer formed using $TiCl_4$ and TEA, and a TiN layer over the TiAlC layer. The thickness of the TiAlC layer is about 50 Å, and the thickness of the TiN layer is about 20 Å. Sample 304 is similar to the sample 302, except sample 302 is not annealed, and sample 304 is annealed in an rapid thermal anneal process. Sample 306 includes a silicon substrate, a gate dielectric over the silicon substrate, a first TiAlC layer formed using $TiCl_4$ and TEA, a second TiAlC layer formed using $TiCl_4$ and TMA, and a TiN layer over the TiAlC layers. The total thickness of the TiAlC layers is about 50 Å, and the thickness of TiN layer is about 20 Å. Sample 308 is similar to the sample 306, except sample 306 is not annealed, and sample 308 is annealed in an rapid thermal anneal process.

The samples are analyzed using Secondary Ion Mass Spectrometry (SIMS). The results are shown in FIG. 19. Lines 312, 314, 316, and 318 are the results of samples 302, 304, 306, and 308, respectively. The X-axis indicates sputter time for sputtering (and hence stripping) the samples, which corresponds to the distance from the tops of the samples to the bottoms. The range of the TiN layer, the TiAlC layer, the gate dielectric layer, and the substrate are marked. It is observed that lines 316 and 318 have aluminum more concentrated at the interface between the TiAlC layer and the underlying gate dielectric, which means lower work functions and better device performance. The peak aluminum atomic percentage of the TiAlC may also be at the interface between the TiAlC and the gate dielectric. As a comparison, lines 312 and 314 have aluminum more concentrated at the interface between the TiAlC layer and the overlying TiN layer, which means the aluminum has little effect, if any, to the work function of the respective gates. Accordingly, samples 306 and 308 (FIG. 18) have better results than samples 302 and 304. Furthermore, the line 312 is close to the line 314, and the line 316 is close to the line 318. This indicates that the anneal process does not significantly change the distribution of aluminum.

Referring back to FIG. 15, in accordance with some embodiments, n-type work function layer 172 includes two layers 172A and 172B. In accordance with other embodiments, n-type work function layer 172 may include more layers. For example, FIG. 15 illustrates n-type work function layers 172C and 272C over layers 172B and 272B, respectively. N-type work function layers 172C and 272C may be formed to have a lower deposition rate, and/or a lower aluminum atomic percentage than the underlying n-type work function layers 172B and 272B. For example, n-type work function layers 172A and 272A may be formed using $TiCl_4$ and TEA (without TTBA and TMA) as the precursor, n-type work function layers 172B and 272B may be formed using $TiCl_4$ and TTBA (without TEA and TMA) as the precursor, and n-type work function layers 172C and 272C may be formed using $TiCl_4$ and TMA (without TEA and TTBA) as the precursor. The formation of each of layers 172A, 172B, and 172C may include one or a plurality of ALD cycles to achieve a desirable total thickness for n-type work function layer 172.

Figure 16:
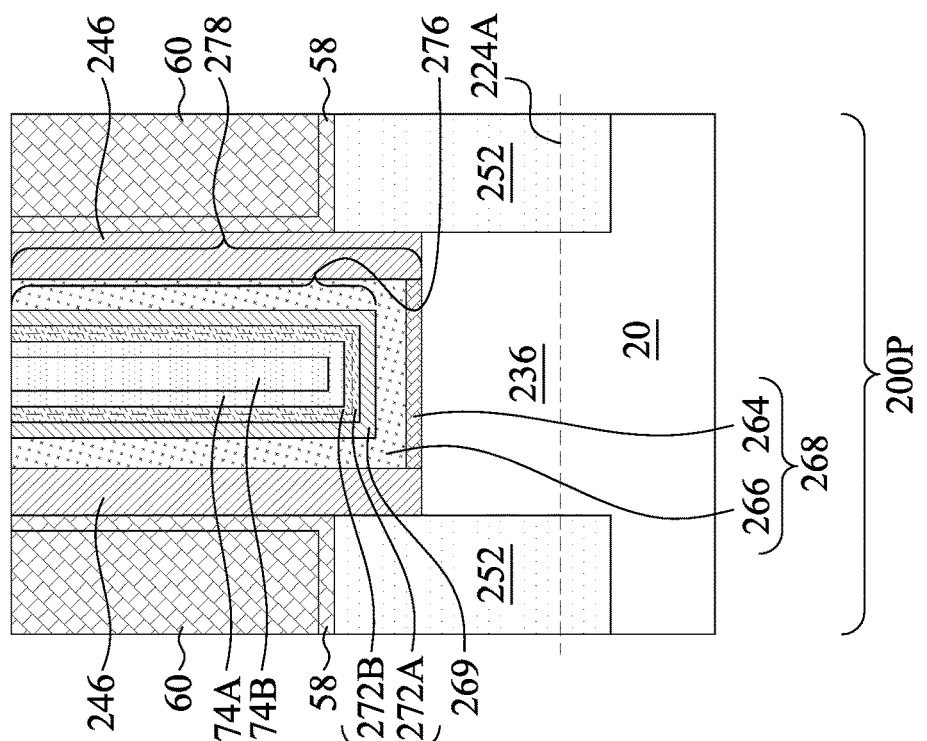
Figure 16:
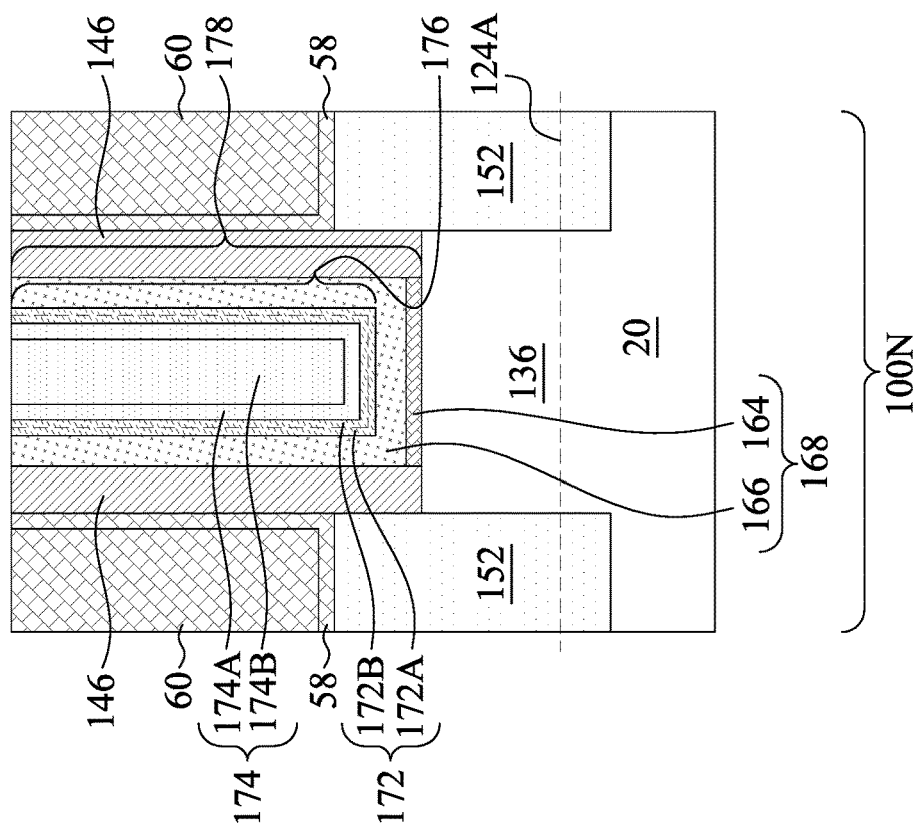

FIG. 16 illustrates the remaining formation process of replacement gates. The respective process is illustrated as process 432 in the process flow 400 as shown in FIG. 21. In the remaining formation process, additional layers may be deposited to fully fill trenches 162 and 262 (FIG. 15) if the trenches have not been fully filled. The additional layers are represented as layers 174 and 274. In accordance with some embodiments, the additional layers include a glue layer 174A/274A, which may be formed TiN, and a filling metal 174B/274B over the glue layer 174A/274A, wherein the filling metal 174B/274B may include tungsten, cobalt, or the like. A planarization process such as a CMP process or a mechanical grinding process is then performed, forming metal gate electrodes 176 and 276. Replacement gate stacks 178 and 278, which include the corresponding gate electrodes 176 and 276 and the corresponding gate dielectrics 168 and 268, respectively, are also formed.

Figure 17A:
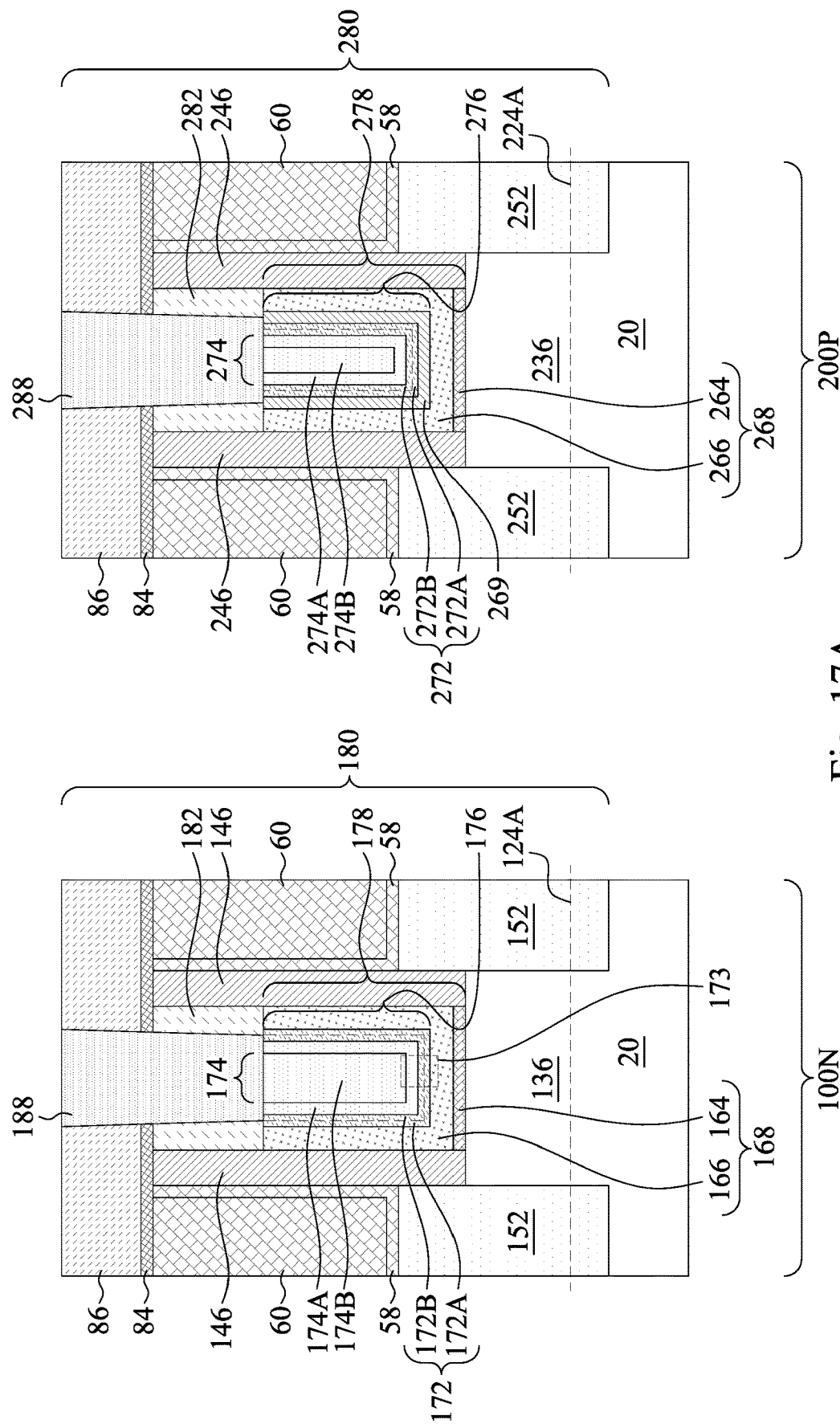

Referring to FIG. 17A, gate electrodes 176 and 276 are recessed, and are filled with a dielectric material (such as SiN) to form hard masks 182 and 282. Etch stop layer 84 is formed over hard masks 182 and 282 and ILD 60. Etch stop layer 84 is formed of a dielectric material, which may include silicon nitride, silicon oxynitride, or the like. ILD 86 is formed over etch stop layer 84, and gate contact plugs 188 and 288 are formed in ILD 86. FinFETs 180 and 280 are thus formed.

Figure 17B:
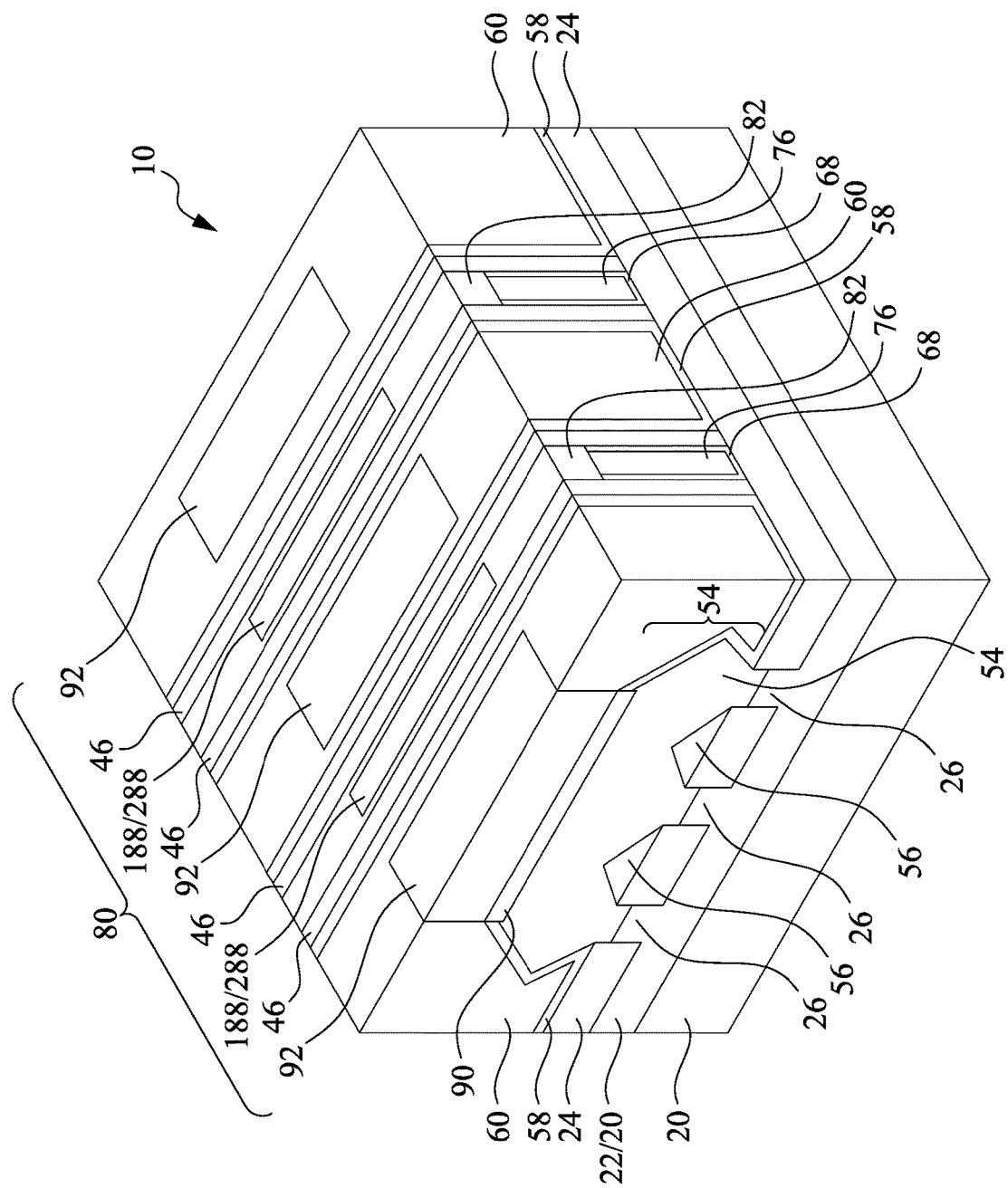

FIG. 17B illustrates a perspective view of FinFET 80, which may represent either one of FinFETs 180 and 280 in FIG. 17A. The gate contacts 188/288 in FIG. 17B represent either the gate contact plugs 188 or 288 in FIG. 17A. The hard masks 82 in FIG. 17B represent the hard masks 182 and 282 in FIG. 17A. Source/drain silicide regions 90 and source/drain contact plugs 92 are also illustrated in FIG. 17A.

Figure 20:
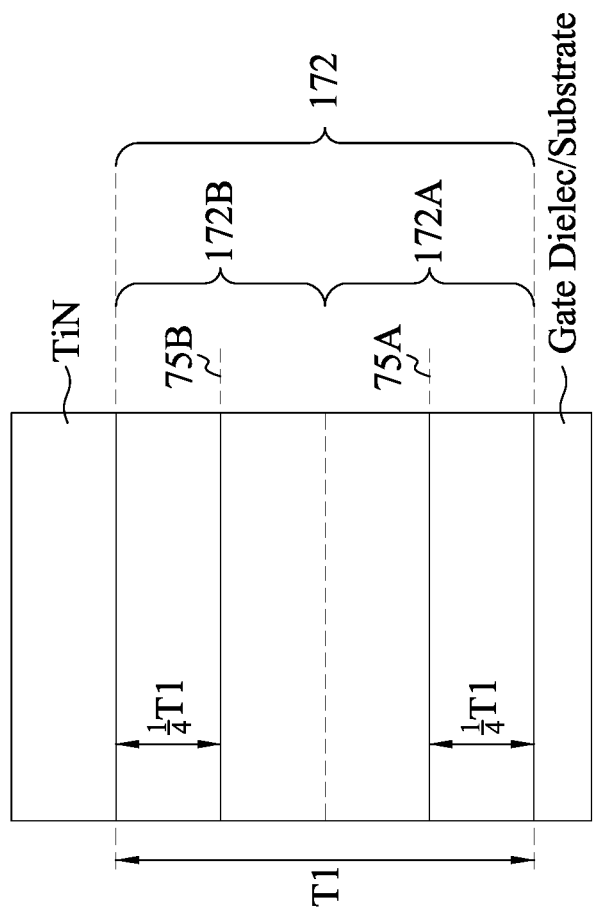
FIG. 20 illustrates an n-type work function layer and portions at different positions in accordance with some embodiments.

FIG. 20 illustrates a magnified view of region 173 in FIG. 17A. The thickness of n-type work function layer 172 is denoted as T1. Line 75A is a level having a vertical distance of ¼T1 from the bottom of n-type work function layer 172, and line 75B is a level having a vertical distance of ¼T1 from the top of n-type work function layer 172. The interface of n-type work function layers 172A and 172B may be somewhere between lines 75A and 75B, although the interface may also be higher than line 75B or lower than line 75A. The aluminum atomic percentage of the portion of layer 172 at level 75A is denoted as AAP75A, and the aluminum atomic percentage of the portion of layer 172 at level 75B is denoted as AAP75B. In accordance with some embodiments, aluminum atomic percentage AAP75B is smaller than aluminum atomic percentage AAP75A. Furthermore, ratio AAP75B/AAP75A may be in the range between about 0.1 and about 0.9. In accordance with some embodiments, an entirety of the lower half of n-type work function layer 172 has aluminum atomic percentages greater than the upper half of n-type work function layer 172, as is also revealed in FIG. 19.

It is appreciated that although TiAlC is used as an example to disclose the concept of using multiple precursors to form a work function layer, the work function layer is not limited to TiAlC. For example, TaAlC may be formed. Furthermore, the work function layer is not limited to the work function layer of n-type FinFETs, and the concept of the present application may be applied on the work function layers of the p-type n-type FinFETs.

The embodiments of the present disclosure have some advantageous features. By forming the lower part and the upper part of the work function layer using different precursors, the lower part may have a higher aluminum atomic percentage than the upper part. This leads to more aluminum at the interface between the work function layer and the underlying high-k dielectric layer. The performance of the resulting FinFET is thus improved. Furthermore, the upper part has a lower deposition rate (thickness per ALD cycle), and hence may be used in combination with the lower part to achieve an accurate desirable total thickness for the ultrathin work function layer.

In accordance with some embodiments of the present disclosure, a method includes forming a gate dielectric layer on a semiconductor region; depositing a first aluminum-containing work function layer using a first aluminum-containing precursor, wherein the first aluminum-containing work function layer is over the gate dielectric layer; depositing a second aluminum-containing work function layer using a second aluminum-containing precursor different from the first aluminum-containing precursor, wherein the second aluminum-containing work function layer is deposited over the first aluminum-containing work function layer; and forming a conductive region over the second aluminum-containing work function layer. In an embodiment, both of the first aluminum-containing work function layer and the second aluminum-containing work function layer comprise TiAlC. In an embodiment, the first aluminum-containing work function layer is deposited to have a higher aluminum atomic percentage than the second aluminum-containing work function layer. In an embodiment, the first aluminum-containing precursor comprises TEA, and the second aluminum-containing precursor comprises TTBA or TMA. In an embodiment, the second aluminum-containing precursor comprises TTBA, and the method further comprises depositing a third aluminum-containing work function layer over the second aluminum-containing work function layer, and the third aluminum-containing work function layer is deposited using a third aluminum-containing precursor comprising TMA. In an embodiment, the first aluminum-containing precursor comprises TTBA, and the second aluminum-containing precursor comprises TMA. In an embodiment, both of the first aluminum-containing work function layer and the second aluminum-containing work function layer are deposited using atomic layer deposition. In an embodiment, the first aluminum-containing work function layer has a first per-cycle-thickness greater than a second per-cycle-thickness of the second aluminum-containing work function layer. In an embodiment, the first aluminum-containing work function layer and the second aluminum-containing work function layer are deposited at a same temperature, and are in-situ deposited without vacuum break in between.

In accordance with some embodiments of the present disclosure, a device includes a semiconductor region; a gate dielectric over the semiconductor region; a work function layer comprising a bottom surface contacting the gate dielectric, wherein the work function layer comprises TiAlC, and wherein the work function layer comprises a top portion, wherein the top portion has a first aluminum atomic percentage; and a bottom portion, wherein the bottom portion has a second aluminum atomic percentage, and wherein the first aluminum atomic percentage is smaller than the second aluminum atomic percentage; and a glue layer over work function layer. In an embodiment, a ratio of the first aluminum atomic percentage to the second aluminum atomic percentage is smaller than about 90 percent. In an embodiment, a ratio of the first aluminum atomic percentage to the second aluminum atomic percentage is in a range between about 10 percent and about 90 percent. In an embodiment, the work function layer comprises an upper half and a lower half, and an entirety of the upper half has lower aluminum atomic percentages than the lower half. In an embodiment, the glue layer comprises titanium nitride. In an embodiment, the semiconductor region comprises a semiconductor fin, and the gate dielectric is formed on sidewalls and an additional top surface of the semiconductor fin.

In accordance with some embodiments of the present disclosure, a device includes a semiconductor fin; a high-k gate dielectric on the semiconductor fin; and a gate electrode comprising a work function layer comprising aluminum over the high-k gate dielectric, the work function layer comprising a lower half, wherein a peak aluminum atomic percentage of the work function layer is in the lower half of the work function layer; and an upper half over the lower half, wherein atomic percentages in the upper half are lower than aluminum atomic percentages in the lower half; and a glue layer over and contacting the work function layer. In an embodiment, from a bottom of the upper half to a top of the upper half, aluminum atomic percentages reduce continuously. In an embodiment, the work function layer further comprises titanium. In an embodiment, the gate electrode is comprised in an n-type Fin Field-Effect Transistor. In an embodiment, the peak aluminum atomic percentage is at an interface between the lower half and the high-k gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate dielectric layer on a semiconductor region;
    depositing a first aluminum-containing work function layer using a first aluminum-containing precursor comprising triethylaluminum (TEA), wherein the first aluminum-containing work function layer is over the gate dielectric layer, and wherein the first aluminum-containing work function layer is deposited at a first temperature;
    depositing a second aluminum-containing work function layer using a second aluminum-containing precursor comprising Trimethylaluminum (TMA), wherein the second aluminum-containing work function layer is deposited over the first aluminum-containing work function layer, and wherein the second aluminum-containing work function layer is deposited at a second temperature different from the first temperature; and
    forming a conductive region over the second aluminum-containing work function layer.

2. The method of claim 1 further comprising:
    depositing a first titanium nitride layer on the gate dielectric layer, wherein the first aluminum-containing work function layer is deposited over and in physical contact with the first titanium nitride layer; and
    depositing a second titanium nitride layer as a part of the conductive region, wherein the second titanium nitride layer is over and in physical contact with the second aluminum-containing work function layer.

3. The method of claim 2, wherein the first aluminum-containing work function layer is further in physical contact with the second aluminum-containing work function layer.

4. The method of claim 1, wherein the first aluminum-containing work function layer and the second aluminum-containing work function layer have a total thickness, and wherein each of the first aluminum-containing work function layer and the second aluminum-containing work function layer has a thickness greater than about ¼ of the total thickness.

5. The method of claim 1, wherein both of the first aluminum-containing work function layer and the second aluminum-containing work function layer comprise TiAlC.

6. The method of claim 1, wherein the depositing the first aluminum-containing work function layer is performed through a first total number of atomic layer deposition (ALD) cycles, and the depositing the second aluminum-containing work function layer is performed through a second total number of ALD cycles different from the first total number of ALD cycles.

7. The method of claim 6, wherein the first aluminum-containing work function layer has a first per-cycle-thickness greater than a second per-cycle-thickness of the second aluminum-containing work function layer.

8. The method of claim 1, wherein both of the first aluminum-containing work function layer and the second aluminum-containing work function layer are deposited using chemical vapor deposition processes.

9. The method of claim 1, wherein the first aluminum-containing work function layer and the second aluminum-containing work function layer are in-situ deposited without vacuum break in between.

10. The method of claim 1, wherein the second temperature is higher than the first temperature.

11. A method comprising:
forming a gate dielectric over a semiconductor region;
depositing an aluminum-containing layer over the gate dielectric, wherein the depositing the aluminum-containing layer comprises:
depositing a first sub-layer over and in physical contact with the gate dielectric, wherein the first sub-layer is deposited as having a first aluminum atomic percentage, and wherein the first sub-layer is deposited at a first temperature; and
depositing a second sub-layer over and in physical contact with the first sub-layer, wherein the second sub-layer is deposited as having a second aluminum atomic percentage lower than the first aluminum atomic percentage, and wherein the second sub-layer is deposited at a second temperature different from the first temperature; and
depositing a titanium nitride layer over and physically contacting the second sub-layer.

12. The method of claim 11, wherein the gate dielectric, the aluminum-containing layer, and the titanium nitride layer are comprised in an n-type transistor.

13. The method of claim 11, wherein the first temperature is lower than the second temperature.

14. The method of claim 11, wherein the first temperature is higher than the second temperature.

15. The method of claim 11, wherein the first sub-layer is deposited using triethylaluminum (TEA) as a first precursor, and wherein the second sub-layer is deposited using Trimethylaluminum (TMA) as a second precursor.

16. The method of claim 11, wherein the second sub-layer further comprises a lower sub-layer and an upper-sub layer, with the upper-sub layer being deposited as having a lower aluminum atomic percentage than the lower sub-layer.

17. A method comprising:
depositing a semiconductor fin;
depositing a high-k gate dielectric on the semiconductor fin; and
forming a gate electrode over the high-k gate dielectric, wherein the forming the gate electrode comprises:
depositing a work function layer comprising aluminum, the depositing the work function layer comprising:
depositing a lower part, wherein a peak aluminum atomic percentage of the work function layer is in the lower part of the work function layer, and wherein the depositing the lower part is performed at a first temperature; and
depositing an upper part over the lower part, wherein the depositing the upper part is performed at a second temperature different from the first temperature; and
depositing a glue layer over and contacting the work function layer, wherein from a top surface of the lower part to a bottom surface of the glue layer, atomic percentages of aluminum drops continuously.

18. The method of claim 17, wherein the second temperature is higher than the first temperature.

19. The method of claim 17, wherein the high-k gate dielectric and the gate electrode are comprised in an n-type transistor.

20. The method of claim 17, wherein the high-k gate dielectric and the gate electrode are comprised in a p-type transistor.

* * * * *